United States Patent
Yaegashi et al.

(10) Patent No.: US 7,687,346 B2
(45) Date of Patent: Mar. 30, 2010

(54) METHOD OF MANUFACTURING A NON-VOLATILE NAND MEMORY SEMICONDUCTOR INTEGRATED CIRCUIT

(75) Inventors: Toshitake Yaegashi, Yokohama (JP); Yoshio Ozawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 141 days.

(21) Appl. No.: 11/943,325

(22) Filed: Nov. 20, 2007

(65) Prior Publication Data

US 2008/0070362 A1    Mar. 20, 2008

Related U.S. Application Data

(62) Division of application No. 11/087,592, filed on Mar. 24, 2005, now Pat. No. 7,309,891.

(30) Foreign Application Priority Data

Aug. 23, 2004  (JP) ............... 2004-242558

(51) Int. Cl.
   *H01L 21/336* (2006.01)
(52) U.S. Cl. ............... 438/257; 257/E21.179; 257/E21.209; 257/E21.422; 257/E21.68
(58) Field of Classification Search ......... 438/257, 438/E21, 179, E21.209, E21.422, E21.68
   See application file for complete search history.

(56) References Cited

U.S. PATENT DOCUMENTS

| | | | |
|---|---|---|---|
| 6,703,699 B2 | 3/2004 | Goda et al. | |
| 6,720,612 B2 | 4/2004 | Takeuchi et al. | |
| 6,784,041 B2 * | 8/2004 | Takeuchi et al. | 438/201 |
| 6,917,072 B2 * | 7/2005 | Noguchi et al. | 257/324 |
| 7,045,413 B2 | 5/2006 | Lee et al. | |
| 7,166,889 B2 | 1/2007 | Tsunoda et al. | |
| 2005/0218442 A1 | 10/2005 | Hieda | |
| 2005/0237847 A1 | 10/2005 | Goda et al. | |
| 2005/0258543 A1 | 11/2005 | Yaegashi | |
| 2006/0157801 A1 | 7/2006 | Goda et al. | |
| 2006/0186464 A1 | 8/2006 | Sakuma et al. | |
| 2006/0250849 A1 | 11/2006 | Ichige et al. | |
| 2007/0004143 A1 | 1/2007 | Saito et al. | |

(Continued)

FOREIGN PATENT DOCUMENTS

JP    3-242934    10/1991

(Continued)

*Primary Examiner*—Jerome Jackson, Jr.
*Assistant Examiner*—Paul A Budd
(74) *Attorney, Agent, or Firm*—Oblon, Spivak, McClelland, Maier & Neustadt, L.L.P.

(57) ABSTRACT

A semiconductor integrated circuit device includes first, second gate electrodes, first, second diffusion layers, contact electrodes electrically connected to the first diffusion layers, a first insulating film which has concave portions between the first and second gate electrodes and does not contain nitrogen as a main component, a second insulating film which is formed on the first insulating film and does not contain nitrogen as a main component, and a third insulating film formed on the first diffusion layers, first gate electrodes, second diffusion layers and second gate electrodes with the second insulating film disposed therebetween in a partial region. The second insulating film is formed to fill the concave portions and a portion between the first and second gate electrodes has a multi-layered structure containing at least the first and second insulating films.

19 Claims, 26 Drawing Sheets

U.S. PATENT DOCUMENTS

2007/0012981 A1 1/2007 Yaegashi
2007/0012991 A1 1/2007 Yaegashi

FOREIGN PATENT DOCUMENTS

| | | |
|---|---|---|
| JP | 2001-148428 | 5/2001 |
| JP | 2002-141420 | 5/2002 |
| JP | 2002-280463 | 9/2002 |
| JP | 2003-197779 | 7/2003 |

\* cited by examiner

← Word-line direction →

METHOD OF MANUFACTURING A NON-VOLATILE NAND MEMORY SEMICONDUCTOR INTEGRATED CIRCUIT

CROSS-REFERENCE TO RELATED APPLICATIONS

This application is a divisional of and claims the benefit of priority under 35 USC §120 from U.S. Ser. No. 11/087,592, filed Mar. 24, 2005 and is based upon and claims the benefit of priority under 35 USC §119 from the Japanese Patent Application No. 2004-242558, filed Aug. 23, 2004, the entire contents of both of which are incorporated herein by reference.

BACKGROUND OF THE INVENTION

1. Field of the Invention

This invention relates to a semiconductor integrated circuit device and more particularly to a semiconductor integrated circuit device containing a nonvolatile semiconductor memory device.

2. Description of the Related Art

For example, a NAND type nonvolatile semiconductor memory device is known as a nonvolatile semiconductor memory device having two-layered gate electrodes of floating gates and control gates.

The NAND type nonvolatile semiconductor memory device has a memory cell array in which a drain-side selection transistor STD and source-side selection transistor STS are arranged on both ends of a series connected circuit of memory cell transistors MC. The selection transistor STD is electrically connected to a bit line via a bit line contact electrode and the selection transistor STS is connected to a source line via a source line contact electrode.

The bit line contact electrode and source line contact electrode are formed by forming contact holes in an inter-level insulating film and filling a conductive material into the contact holes. However, in the photolithography process performed when the contact holes are formed, the contact holes penetrate into the element isolation region in some cases. This is caused by misalignment of the photomask. If the contact holes thus penetrate into the element isolation region, the bit line contact electrode or source line contact electrode is brought into contact with the semiconductor substrate, for example. As a result, a leak current increases to make the device faulty.

Therefore, in order to suppress the device from becoming faulty even when misalignment occurs, a barrier insulating film formed of a silicon nitride film is formed between the semiconductor substrate, the element isolation region and the inter-level insulating film as an etching stopper.

However, the silicon nitride film used as the barrier insulating film contains a large amount of hydrogen and tends to cause charge traps. After formation of gate electrodes, the silicon nitride film used as the barrier insulating film is formed on each of the surfaces of the gate electrodes, semiconductor substrate and element isolation region. Therefore, the characteristic of a memory cell transistor may be deteriorated in some cases by an influence of charges, for example, electrons trapped in portions of the silicon nitride film which are formed on the diffusion layers formed in the semiconductor substrate between the gate electrodes and the gate electrode side walls. In order to improve the deteriorated characteristic, the technique for forming insulating films such as silicon oxide films between the gate electrode side walls, diffusion layers and silicon nitride film is described in Jpn. Pat. Appln. KOKAI Publication No. 2001-148428.

Further, as the elements are further miniaturized, the influence by the parasitic capacitances between the floating gates and between the control gates becomes larger and the influence is given to the transistor characteristic. When the parasitic capacitance between the floating gates becomes large, a variation in the threshold voltage of a memory cell transistor caused by an influence by a variation in the amount of charges stored in the adjacent floating gate becomes large, thereby making it difficult to control the threshold voltage. Further, when the parasitic capacitance between the control gates becomes large, the wiring delay caused when the control gate is driven becomes large, thereby making the operation speed low.

In order to solve the above problems, it is effective to make small the dielectric constant of the insulating films filled in between the floating gates and between the control gates. For this purpose, it is preferable to completely fill materials such as silicon oxide films having small dielectric constants in between the floating gates and between the control gates. The technique is described in Jpn. Pat. Appln. KOKAI Publication No. 2002-280463.

However, if the amount of buried silicon oxide films increases, a trapped amount of charges, for example, electrons increases more depending on the film quality of the silicon oxide film in comparison with a case where silicon nitride films are filled.

In order to improve the above situation, it is preferable to fill the gap between the gate electrodes with a silicon oxide film having a less hydrogen content and a small amount of charge traps. However, in this case, it is necessary to perform the silicon oxide film forming process at high temperatures for a long period of time. As a result, the manufacturing cost will rise and miniaturization of elements becomes difficult.

BRIEF SUMMARY OF THE INVENTION

A semiconductor integrated circuit device according to a first aspect of the invention comprises a semiconductor substrate;

first gate electrodes formed above the semiconductor substrate;

second gate electrodes formed above the semiconductor substrate;

first diffusion layers each formed in the semiconductor substrate below one of the side surfaces of the first gate electrode;

second diffusion layers each formed in a portion of the semiconductor substrate which lies between a portion lying below the other side surface of the first gate electrode and a portion lying below one of the side surfaces of the second gate electrode;

contact electrodes electrically connected to the first diffusion layers;

a first insulating film which is formed into a shape to have concaves between the first gate electrodes and the second gate electrodes and does not contain nitrogen as a main component;

a second insulating film which is formed on the first insulating film and does not contain nitrogen as a main component, the second insulating film being formed to fill the concaves and a portion between the first and second gate electrodes having a multi-layered structure containing the first and second insulating films;

a third insulating film formed on the first diffusion layers, first gate electrodes, second diffusion layers and second gate electrodes with the second insulating film disposed therebetween in at least a partial region, a position of the lowest portion of the third insulating film which lies on the second diffusion layer is set higher than a position of the lowest portion of a portion which is formed in contact with the contact electrode on the first diffusion layer; and an inter-level insulating film formed on the third insulating film and containing a main component different from that of the third insulating film.

A semiconductor integrated circuit device according to a second aspect of the invention comprises a semiconductor substrate;

a first cell unit which includes a memory cell transistor train containing at least one memory cell transistor having a gate electrode and formed on the semiconductor substrate and a selection transistor formed on the semiconductor substrate, arranged adjacent to one end of the memory cell transistor train and having a gate electrode;

a second cell unit which includes a memory cell transistor train containing at least one memory cell transistor having a gate electrode and formed on the semiconductor substrate and a selection transistor formed on the semiconductor substrate, arranged adjacent to one end of the memory cell transistor train and having a gate electrode;

diffusion layers formed in a portion of the semiconductor substrate which lies between one of the selection transistor and memory cell transistor of the first cell unit and one of the selection transistor and memory cell transistor of the second cell unit;

contact electrodes electrically connected to the diffusion layers;

a first insulating film which is formed into a shape to have at least one concave portion between the gate electrodes of the first and second cell units and does not contain nitrogen as a main component;

a second insulating film which is formed on the first insulating film and does not contain nitrogen as a main component, the second insulating film being formed to fill in the concave portion and portions between the gate electrodes of the first cell unit and between the gate electrodes of the second cell unit having a multi-layered structure which contains at least the first and second insulating films;

a third insulating film which is formed between the gate electrodes of the first cell unit and between the gate electrodes of the second cell unit on the first cell unit, second cell unit and diffusion layers with the first and second insulating films disposed therebetween, a position of the lowest portion of the third insulating film which lies between the gate electrodes being set higher than a position of the lowest portion of a portion which is formed in contact with the contact electrode on the diffusion layer; and an inter-level insulating film formed on the third insulating film and containing a main component different from that of the third insulating film.

A manufacturing method of a semiconductor integrated circuit device according to a third aspect of the invention comprises a forming first and second gate electrodes on a semiconductor substrate;

doping impurity into the semiconductor substrate with the first and second gate electrodes used as a mask to form first and second diffusion layers in the semiconductor substrate;

forming a first insulating film which does not contain nitrogen as a main component and has concave portions between the first and second gate electrodes on the first and second diffusion layers and first and second gate electrodes;

forming a second insulating film which does not contain nitrogen as a main component on the first insulating film to fill the concave portions between the first and second gate electrodes;

forming a third insulating film on the second insulating film;

forming an inter-level insulating film having a main component different from that of the third insulating film on the third insulating film;

etching portions of the inter-level insulating film which lie on contact electrode forming portions of the first diffusion layers to form contact holes, and forming contact electrodes electrically connected to the respective diffusion layers in the contact holes.

A manufacturing method of a semiconductor integrated circuit device according to a fourth aspect of the invention comprises a forming a train of first memory cell gate electrodes, a first selection gate electrode adjacent to the train of first memory cell gate electrodes, a second selection gate electrode adjacent to the first selection gate electrode and a train of second memory cell gate electrodes on a semiconductor substrate;

doping impurity into the semiconductor substrate with the train of first memory cell gate electrodes, first selection gate electrode, second selection gate electrode and the train of second memory cell gate electrodes used as a mask to form a plurality of diffusion layers in the semiconductor substrate;

forming a first insulating film which does not contain nitrogen as a main component and has concave portions between the gate electrodes on the plurality of diffusion layers, the train of first memory cell gate electrodes, first selection gate electrode, second selection gate electrode and the train of second memory cell gate electrodes;

forming a second insulating film which does not contain nitrogen as a main component on the first insulating film to fill the concave portions between the first memory cell gate electrodes and the concave portions between the second memory cell gate electrodes;

forming a third insulating film on the second insulating film;

forming an inter-level insulating film having a main component different from that of the third insulating film on the third insulating film;

etching portions of the inter-level insulating film which lie on contact electrode forming portions of the diffusion layers between the first and second selection gate electrodes to form contact holes; and forming contact electrodes electrically connected to the first diffusion layers in the contact holes.

DETAILED DESCRIPTION OF THE INVENTION

There will now be described embodiments of this invention with reference to the accompanying drawings. In this explanation, common reference symbols are attached to like portions throughout the drawings.

First Embodiment

The first embodiment of this invention is explained with reference to FIGS. 1 to 9 by taking a NAND type nonvolatile semiconductor memory device as an example.

Figure 1:
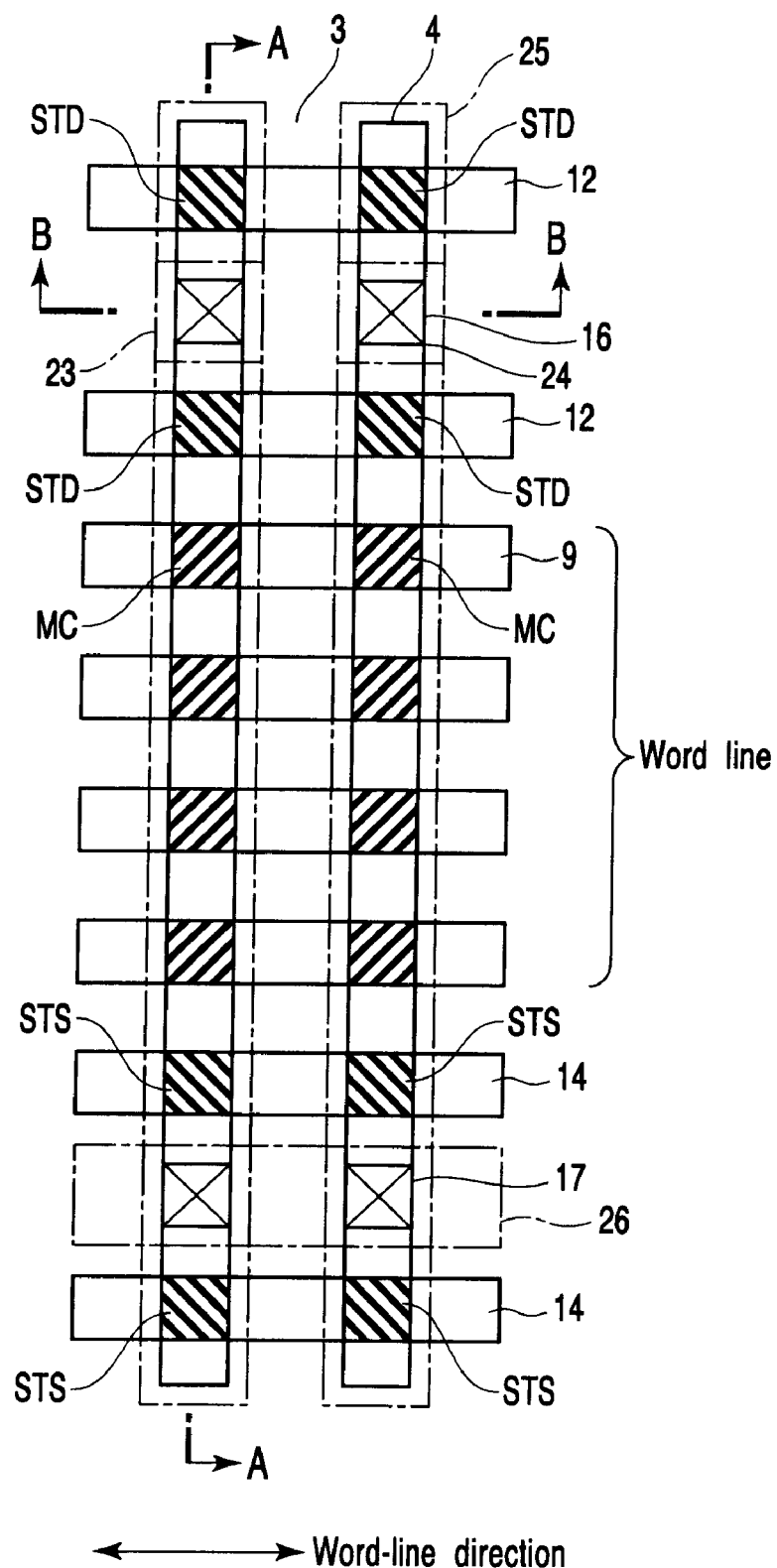
FIG. 1 is a plan view showing an example of the plane pattern of a NAND type nonvolatile semiconductor memory device according to a first embodiment of this invention.

FIG. 1 is a plan view showing an example of the plane pattern of a NAND type nonvolatile semiconductor memory device according to the first embodiment of this invention.

As shown in FIG. 1, each NAND cell unit has four series-connected memory cells MC connected between a drain-side selection transistor STD and a source-side selection transistor STS on a corresponding one of element regions 4 which are divided by an element isolation region 3. The memory cells MC arranged in a word line direction or in a horizontal direction in the drawing are connected to a corresponding one of common control gate lines (word lines) 9. The drain-side selection transistors STD arranged in the word line direction are connected to a corresponding one of common drain-side selection gate lines 12 and the source-side selection transistors STS arranged in the word line direction are connected to a corresponding one of common source-side selection gate lines 14. Each drain-side selection transistor STD is connected to a bit line connecting portion 23 formed of a first wiring layer via a bit line contact electrode 16 and further connected to a bit line 25 via a wiring-wiring contact electrode 24. Each source-side selection transistor STS is connected to a source line 26 formed of the first wiring layer via a source line contact electrode 17.

The four memory cell transistors MC, drain-side selection transistor STD and source-side selection transistor STS configure one memory cell array. One memory cell array is arranged adjacent to another memory cell array in a bit line direction with the bit line contact electrode 16 disposed therebetween and arranged adjacent to another memory cell array in the bit line direction with the source line contact electrode 17 disposed therebetween.

Figure 2:
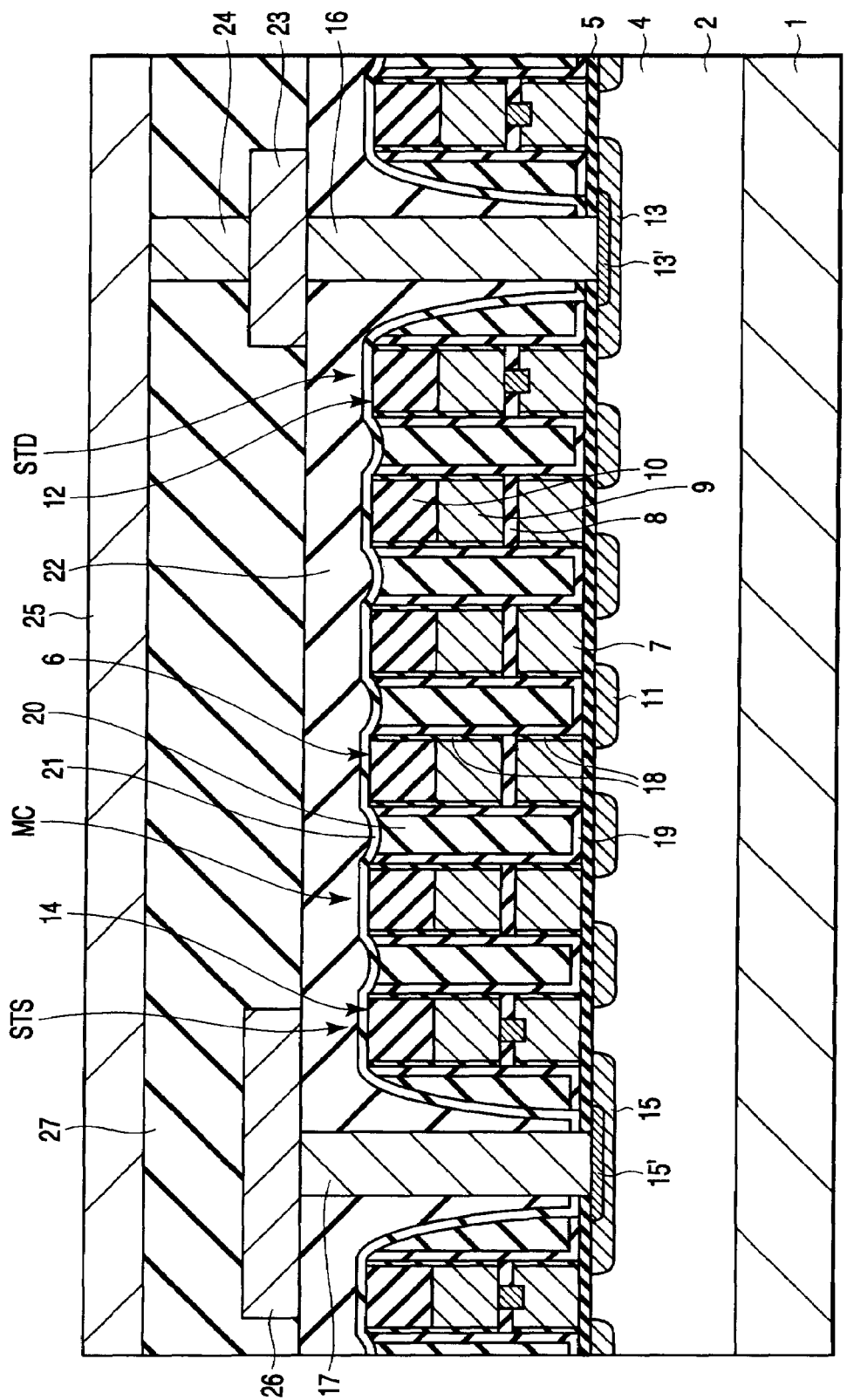
FIG. 2 is a cross sectional view taken along the A-A line of FIG. 1.
Figure 3:
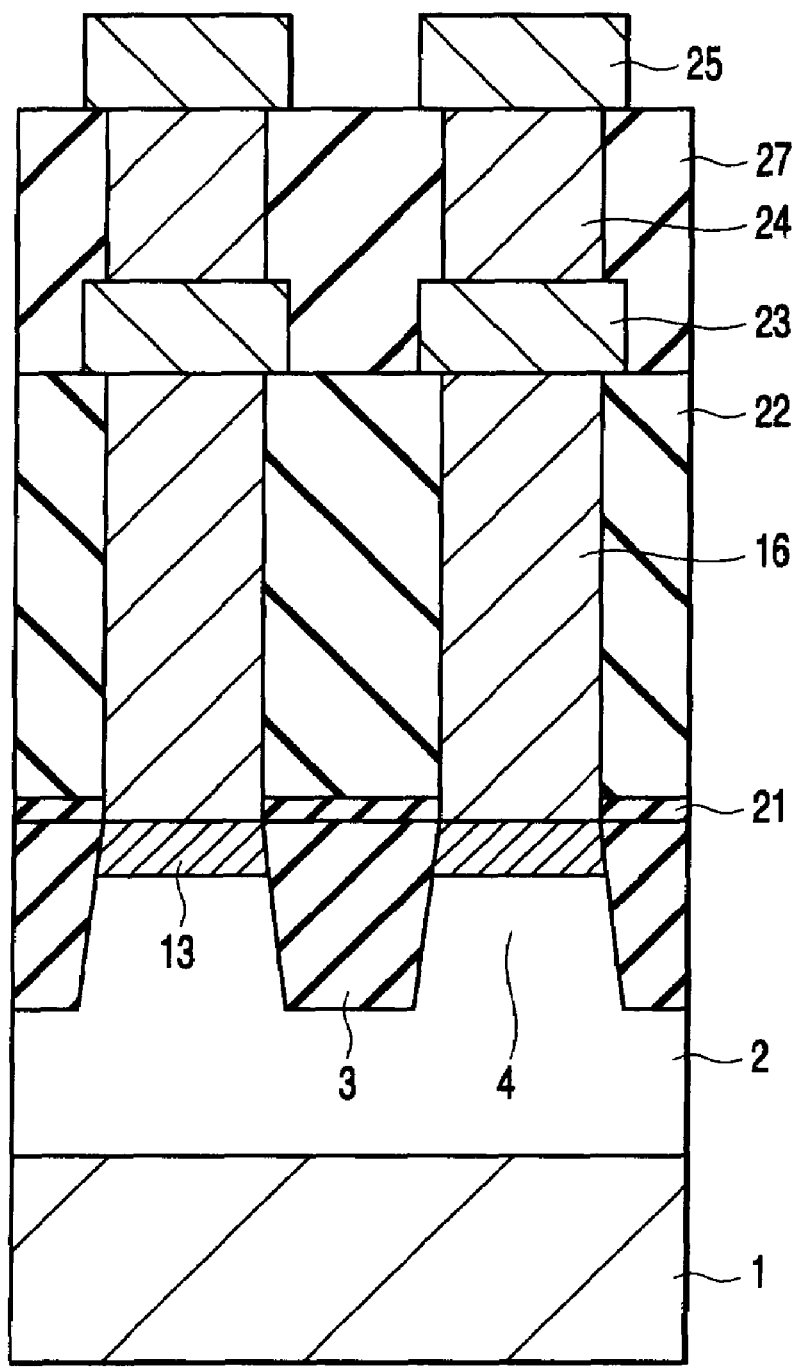
FIG. 3 is a cross sectional view taken along the B-B line of FIG. 1.

FIG. 2 is a cross sectional view taken along the A-A line of FIG. 1 and FIG. 3 is a cross sectional view taken along the B-B line of FIG. 1.

As shown in the cross sectional view of FIG. 2, each of the four memory cells MC in each memory cell array has a memory cell gate electrode 6 formed on a gate insulating film 5 on the element region 4 formed in a well 2 provided on a semiconductor substrate (for example, silicon substrate) 1.

The memory cell gate electrode 6 of this example has a stacked gate structure and includes a floating gate electrode 7 acting as a charge storage layer, a gate-gate insulating film 8 formed on the floating gate electrode 7, a control gate electrode 9 formed on the gate-gate insulating film 8 and a gate mask 10 formed on the control gate electrode 9. The control gate electrode 9 is commonly used by the memory cells MC arranged in the word line direction and acts as the word line.

The source or drain of each memory cell MC is serially connected to the drain or source of an adjacent memory cell by use of a diffusion layer 11.

On the right end portion of the four memory cells MC, a drain-side selection gate electrode (drain-side selection gate line) 12 is formed on the gate insulating film 5. A bit line contact diffusion layer 13 is formed in a portion of the element region 4 which lies to face the selection transistor STD of the drain-side gate electrode 12.

Further, on the left end portion of the four memory cells MC, a source-side selection gate electrode (source-side selection gate line) 14 is formed on the gate insulating film 5. A source line contact diffusion layer 15 is formed in a portion of the element region 4 which lies to face the selection transistor STS of the source-side gate electrode 14.

Each memory cell gate electrode 6 and the diffusion layers 11 formed in the element region 4 on both sides of the memory cell configure one memory cell transistor MC.

Further, the drain-side selection gate electrode 12, the diffusion layer 11 formed in the element region 4 on the memory cell side and the bit line contact diffusion layer 13 configure the drain-side selection transistor STD.

Further, the source-side selection gate electrode 14, the diffusion layer 11 formed in the element region 4 on the memory cell side and the source line contact diffusion layer 15 configure the source-side selection transistor STS.

Thus, the memory cell transistors MC are serially connected to one another without using contacts. Further, the drain-side selection transistor STD and source-side selection transistor STS are connected to both ends of a series circuit of memory cell transistors MC.

The bit line contact diffusion layer 13 is connected to the bit line contact electrode 16 and the source line contact diffusion layer 15 is connected to the source line contact electrode 17.

At this time, the surfaces of the gate electrodes 6, 12, 14 are covered with post-oxidation films 18. First insulating films 19 are formed on the post-oxidation films 18 and gate insulating film 5. The first insulating film 19 does not contain nitrogen as a main component and is formed in a concave shape between the memory cell gate electrodes 6. Further, the first insulating film 19 is suitably formed of a material which has a less hydrogen content, has a small amount of traps for charges and has a small dielectric constant in comparison with a silicon nitride film. One example of the first insulating film 19 is a silicon oxide film.

Second insulating films 20 which do not contain nitrogen as a main component are formed to fill the inside portions of the concave portions formed by the first insulating films 19. The second insulating film 20 is suitably formed of a material which has a small dielectric constant in comparison with a silicon nitride film. One example of the second insulating film 20 is a silicon oxide film.

In this case, the term "fill" does not mean that the internal concave portion is fully filled. Even if a concave such as a void or nest exists in the filled internal concave portion, the same operation and effect thereof can be attained. Thus, the term "fill" means that the internal concave portion is not fully filled and contains a concave therein.

Further, the first insulating film 19 has a less hydrogen content and has a smaller amount of traps for charges in comparison with the second insulating film 20.

The distance between the gate electrodes is shorter for the memory cell gate electrodes 6 and longer for the drain-side selection gate electrodes 12 formed on both sides of the bit line contact electrode 16 and for the source-side selection gate electrodes 14 formed on both sides of the source line contact electrode 17.

A third insulating film 21 is formed on the gate electrodes 6, 12, 14 and the first insulating films 19 and second insulating films 20 between the gate electrodes 6, 12, 14. One example of the third insulating film 21 is a silicon nitride film. The third insulating film 21 has a more hydrogen content and a larger amount of traps for charges in comparison with the first insulating film 19.

An inter-level insulating film 22 is formed on the third insulating film 21. One example of the inter-level insulating film 22 is a silicon oxide film containing boron. One example of the silicon oxide film containing boron is a BPSG film.

The bit line contact electrodes 16 and source line contact electrodes 17 are formed to penetrate through the inter-level insulating film 22, third insulating film 21 and gate insulating film 5 and connected to the respective bit line contact diffusion layers 13 and source line contact diffusion layers 15.

The bit line connecting portions 23 formed of a first-layered wiring are formed on the respective bit line contact electrodes 16 and the bit line 25 formed of a second wiring layer is formed above the bit line connecting portions 23 via the respective wiring-wiring contact electrodes 24.

The source lines 26 formed of the first-layered wiring are formed on the respective source line contact electrodes 17. The source lines 26, bit line connecting portions 23 and wiring-wiring contact electrodes 24 are covered with a wiring-wiring insulating film 27 and the bit line 25 is formed on the insulating film 27.

The NAND cell according to the first embodiment is formed by connecting the four memory cell transistors MC between the selection transistors STD and STS. However, the number of memory cell transistors MC is not limited to four and can be set to a given number, for example, 16 or 32. Of course, the number of memory cell transistors can be set to less than four.

In this example, the well is of a P type and the source/drain diffusion layer is of an N type. However, the well can be set to an N type and the source/drain diffusion layer can be set to a P type.

In the first embodiment, the gaps between the floating gate electrodes 7 and between the control gate electrodes 9 of the adjacent memory cell gate electrodes 6 are filled with the first insulating films 19 and second insulating films 20 and the third insulating film 21 is not formed to enter the gaps. Further, the first insulating film 19 and second insulating film 20 are respectively formed as side walls on the side surface of the drain-side selection gate electrode 12 which lies to face the memory cells and on the side surface of the source-side selection gate electrode 14 which lies to face the memory cells. The side walls can be used as a mask in the ion-implantation process for formation of LDD (lightly doped diffusion) regions.

In the cross sectional view of FIG. 3, the element isolation region 3 is formed in the well 2 on the semiconductor substrate 1 and the element regions 4 divided by the element isolation region 3 are formed. The bit line contact electrodes 16 are formed on the entire surface of each of the element regions 4. Further, the third insulating film 21 is formed on the element isolation region 3. The inter-level insulating film 22 is formed on the third insulating film 21. Each of the bit line contact electrodes 16 is formed to penetrate through the inter-level insulating film 22 and third insulating film 21. Each of the bit line contact electrodes 16 is connected to a corresponding one of the bit line connecting portions 23 and further connected to the bit line 25 via the wiring-wiring contact electrode 24. The bit line connecting portions 23 and wiring-wiring contact electrodes 24 are covered with the wiring-wiring insulating film 27.

In this case, the upper surface of the element isolation region 3 is set in alignment with the upper surface of the element region 4. However, the upper surface of the element isolation region 3 can be set higher than the upper surface of the element region 4.

As the element isolation method, an STI (shallow trench isolation) method is used, but another element isolation method such as a LOCOS (local oxidation of silicon) method can be used.

According to the nonvolatile semiconductor memory device of the first embodiment, the insulating film filled into between the memory cell gate electrodes is divided into two layers containing the first insulating film 19 and second insulating film 20 and the third insulating film 21 acting as an etching stopper when contact holes are formed is formed on the second insulating film 20. Further, the first insulating film 19 which has a less hydrogen content and a smaller amount of charge traps in comparison with the second insulating film 20 and third insulating film 21 is formed under the second insulating film 20. Thus, the second insulating film 20 and third insulating film 21 can be prevented from lying near the gate insulating film 5 of the memory cell transistor MC, for example, from being directly brought into contact with the gate insulating film 5. As a result, an influence given by hydrogen contained in the second insulating film 20 and third insulating film 21 and charges trapped in the second insulating film 20 and third insulating film 21 to the electrical characteristic of the memory cell transistor MC can be alleviated.

Further, the gap between the memory cell gate electrodes 6 are filled with the first insulating film 19 and second insulating film 20 having a smaller dielectric constant than the third insulating film 21. As a result, deterioration in the wiring delay in the control gate electrode 6 of the memory cell transistor MC can be suppressed.

In addition, it is assumed that the third insulating film 21 is formed of a material which has a certain selective etching ratio with respect to both of the element isolation region 3 and inter-level insulating film 22. As a result, even if the width of the element region 4 is narrowed, it can be suppressed that the contact holes penetrate into the element isolation region 3 and the contact electrodes 16 and 17 are brought into contact with the well 2.

That is, with the nonvolatile semiconductor memory device according to the first embodiment, deterioration of the electrical characteristic such as wiring delay of the gate electrode, a lowering in the withstand voltage of the gate insulating film and a variation in the threshold voltage of the transistor can be prevented while the process margin for etching to form the contact holes is kept high. Therefore, according to the first embodiment, the nonvolatile semiconductor memory device with a high manufacturing yield which can be operated with high reliability at high operation speed and the manufacturing method thereof can be provided.

Next, one example of the manufacturing method of the nonvolatile semiconductor memory device according to the first embodiment is explained with reference to FIGS. 2 and 4 to 9.

Figure 4:
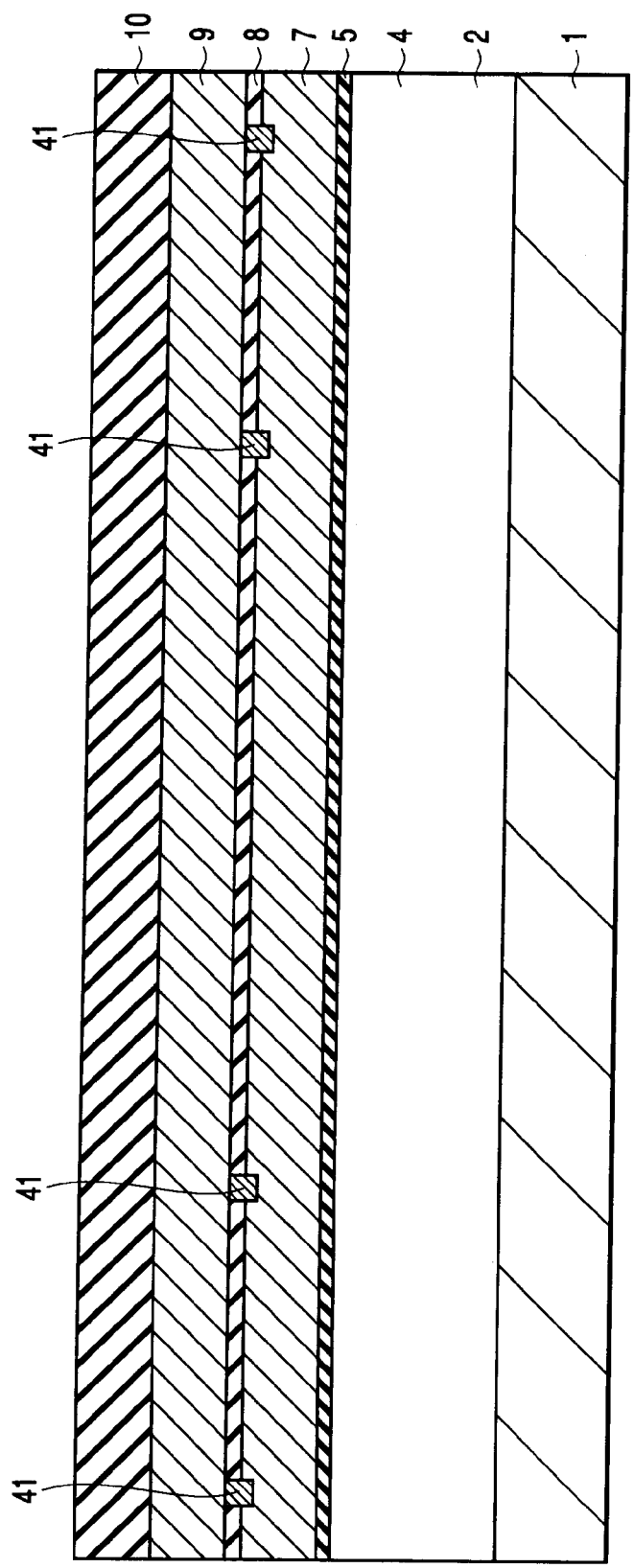
FIG. 4 is a cross sectional view showing an example of a manufacturing step of the NAND type nonvolatile semiconductor memory device according to the first embodiment of this invention.

First, as shown in FIG. 4, a well 2 and element regions 4 divided by an element isolation region 3 (not shown) are formed in a semiconductor substrate 1 such as a silicon substrate. One example of the material of the element isolation region 3 is a silicon oxide. Then, a gate insulating film 5 is formed on the element regions 4. Further, a floating gate electrode 7, gate-gate insulating film 8, control gate electrode 9 and gate mask 10 are sequentially formed on the element regions 4. At this time, as indicated by a reference symbol 41, the gate-gate insulating film 8 is partly removed from a region of portions which act as selection gate electrodes so as to connect the floating gate electrode 7 and control gate electrode 9 to each other.

It is possible to form the gate insulating film 5 and floating gate electrode 7 before formation of the element isolation region 3 and form the element isolation region 3 in self-alignment with the floating gate electrode 7. Further, it is possible to form the gate insulating film 5, floating gate electrode 7, gate-gate insulating film 8 and control gate electrode 9 before formation of the element isolation region 3 and form the element isolation region 3 in self-alignment with the floating gate electrode 7 and control gate electrode 9.

Figure 5:
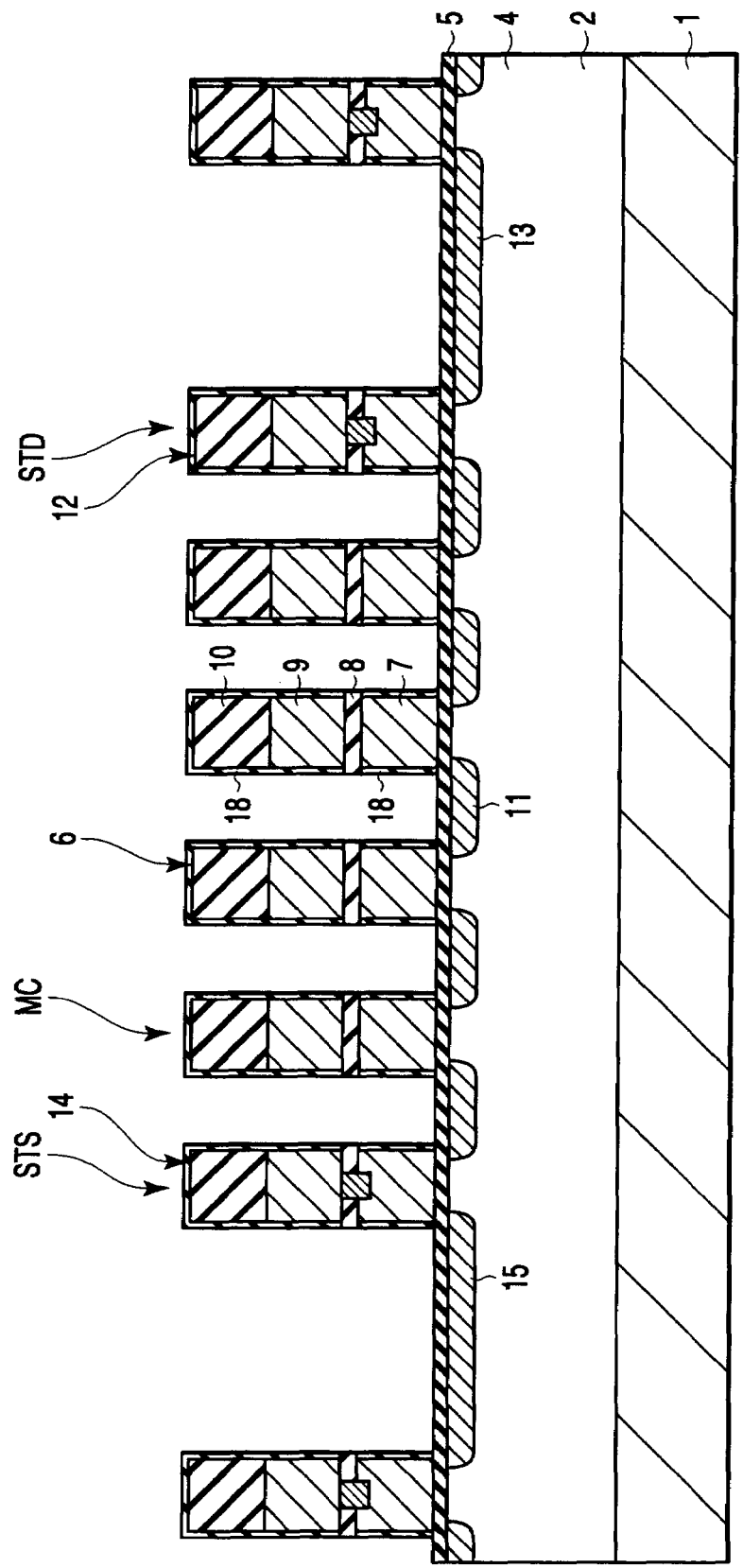
FIG. 5 is a cross sectional view showing an example of a manufacturing step of the NAND type nonvolatile semiconductor memory device according to the first embodiment of this invention.

Next, as shown in FIG. 5, the gate mask 10 is etched into a formation pattern of gate electrodes by use of a photolithography technique. Then, the control gate electrode 9, gate-gate insulating film 8 and floating gate electrode 7 are etched in self-alignment with the gate mask 10 to form memory cell gate electrodes 6, drain-side selection gate electrodes 12 and source-side selection gate electrodes 14. After this, the memory cell gate electrodes 6, drain-side selection gate electrodes 12 and source-side selection gate electrodes 14 are post-oxidized to form post-oxidation films 18 around the gate electrodes 6, 12, 14. Thus, damages caused at the time of gate processing of the gate electrodes 6, 12 and 14 are recovered. Then, impurity of a conductivity type different from that of the impurity of the well 2 is ion-implanted into the element regions 4 with the gate electrodes 6, 12, 14 and element isolation region 3 (not shown) used as a mask to form diffusion layers 11, 13. The ion-implantation process for formation of the diffusion layers 11, 13 may be performed before or after the post-oxidation process. Further, the ion-implantation process may be performed after a first insulating film 19 is formed in a later step.

Figure 6:
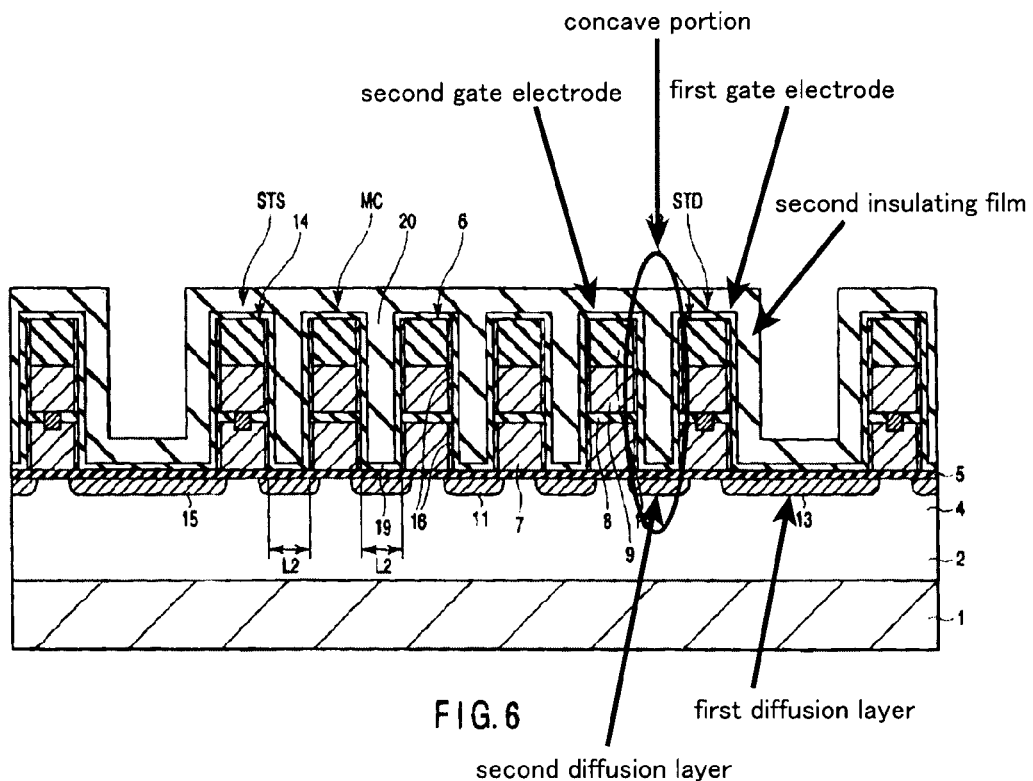
FIG. 6 is a cross sectional view showing an example of a manufacturing step of the NAND type nonvolatile semiconductor memory device according to the first embodiment of this invention.

Next, as shown in FIG. 6, the first insulating film 19 is formed on the surface of the structure shown in FIG. 5, for example, on the post-oxidation film 18, gate insulating film 5 and element isolation region 3 (not shown). At this time, the first insulating film 19 is formed with film thickness so as not to fully fill in between the memory cell gate electrodes 6.

One example of the material of the first insulating film 19 is a silicon oxide. One example of the thickness of the first insulating film 19 is approximately 5 nm on the post-oxidation film 18 existing on the side surface of the memory-cell gate electrode 6 and approximately 5 nm on the gate insulating film 5 when the distance L2 between the memory cell gate electrodes 6 is approximately 70 nm. Further, one example of the formation process is performed at a temperature of 780° C. and at a film formation speed of 0.1 nm/min in an atmosphere of $SiH_2Cl_2+N_2O$. In this condition, a silicon oxide film having the charge trap density of approximately $10^{18}$ cm$^{-3}$ and hydrogen content of approximately 1 mol % can be attained.

Since the first insulating film 19 is formed with film thickness so as not to fully fill in between the memory cell gate electrodes 6, the first insulating film 19 can be formed with smaller film thickness than in a case where the gaps between the memory cell gate electrodes 6 are fully filled. Further, when the first insulating film 19 is formed, the process performed for a long period of time at high temperatures to attain an insulating film with a less hydrogen content and a smaller amount of charge traps can be used. A silicon oxide film formed by the above process is called an HTO (High Temperature Oxide) film in the semiconductor field.

After the first insulating film 19 is formed, the first insulating film 19 can be processed in a oxidation atmosphere. By processing the first insulating film 19 in an oxidation atmosphere, for example, a small amount of hydrogen contained in the first insulating film 19 can be removed from the first insulating film 19. For example, oxygen molecules $O_2$ and hydrogen molecules $H_2$ are combined to form $H_2O$ and evaporate. Therefore, hydrogen in the first insulating film 19 can be further reduced. For example, the above advantage is an advantage inherent to this invention which cannot be attained by the technique described in Jpn. Pat. Appln. KOKAI Publication No. 2002-280463. The reason is that an oxidizer cannot reach a portion near the gate electrode or diffusion layer since the film thickness of the silicon oxide film is large in the technique described in Jpn. Pat. Appln. KOKAI Publication No. 2002-280463.

Next, a second insulating film 20 is formed on the first insulating film 19. The second insulating film 20 is formed with film thickness so as to fully fill in between the memory cell gate electrodes 6 and not to fully fill in between the drain-side selection gate electrodes 12 and between the source-side selection gate electrodes 14.

One example of the material of the second insulating film 20 is a silicon oxide. One example of the thickness of the second insulating film 20 is approximately 60 nm on the post-oxidation film 18 existing on the upper surface of the memory cell gate electrode 6 when the distance L2 between the memory cell gate electrodes 6 is approximately 70 nm. Further, one example of the formation process is performed at a temperature of 700° C. and at a film formation speed of 3 nm/min in an atmosphere of $Si(OC_2H_5)_4$. In this condition, a silicon oxide film having a hydrogen content of approximately 5 mol % can be attained.

In this case, $Si(OC_2H_5)_4$ gas, that is, TEOS (Tetraethoxy Silane) is used as source gas for formation of the second insulating film 20 of this example, that is, silicon oxide. The silicon oxide film formed by using TEOS as the source gas is called a TEOS film in the semiconductor field.

Figure 7:
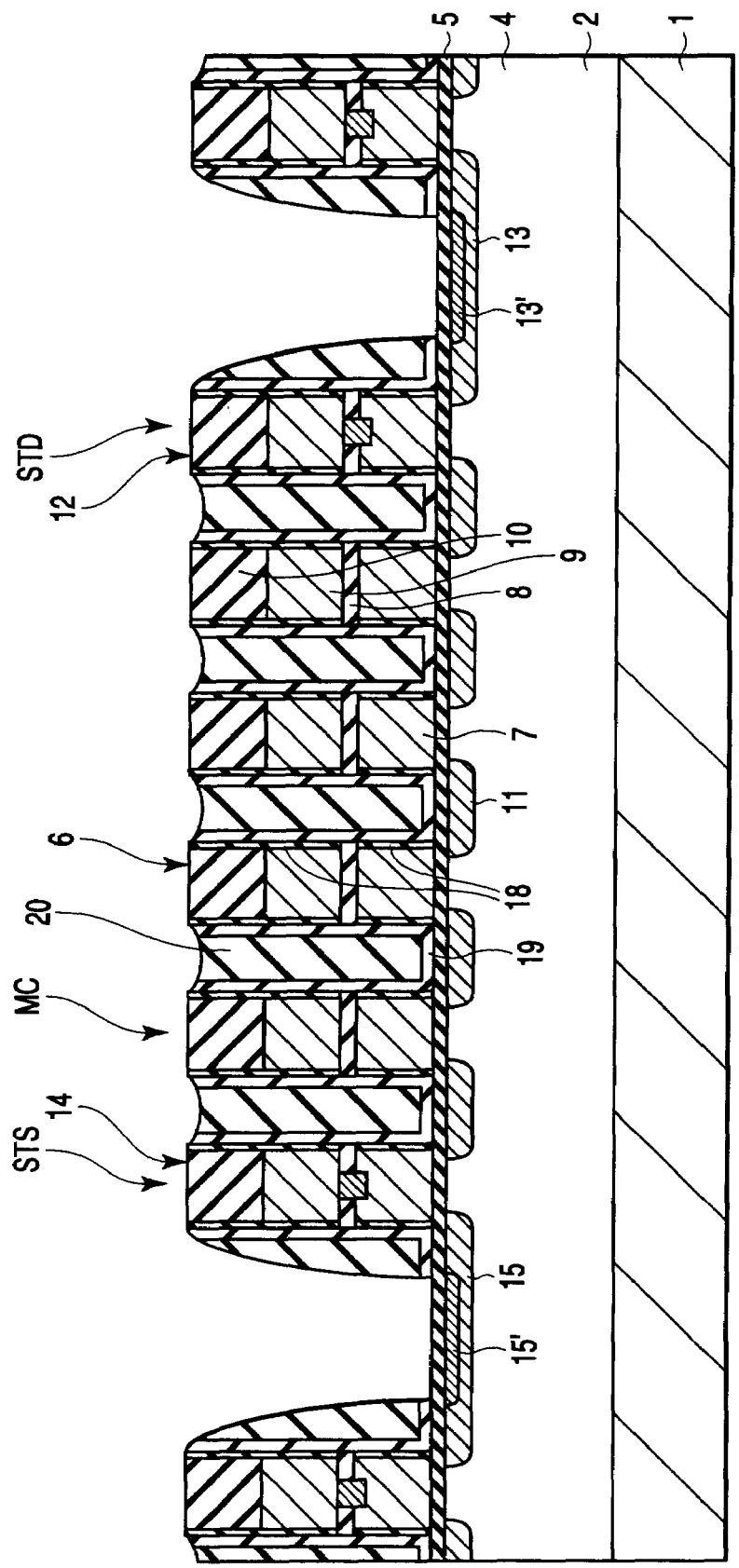
FIG. 7 is a cross sectional view showing an example of a manufacturing step of the NAND type nonvolatile semiconductor memory device according to the first embodiment of this invention.

Next, as shown in FIG. 7, the first insulating film 19 and second insulating film 20 are selectively etched out so as to be left behind between the memory cell gate electrodes 6. At this time, the first insulating film 19 and second insulating film 20 are left behind as side walls on the side surface of the drain-side selection gate electrode 12 which lies to face the memory cells and on the side surface of the source-side selection gate electrode 14 which lies to face the memory cells. For this purpose, an anisotropic etching process may be used. After this, if necessary, impurity having the same conductivity type as that of the diffusion layers 13, 15 is ion-implanted into the diffusion layers 13, 15 with the first insulating film 19, second insulating film 20 and gate electrodes 6, 12, 14 used as a mask. As a result, each of the selection gate transistors STD, STS come to have an LDD structure on one side. That is, the impurity concentration of portions below the bit line contact electrodes 16 and source line contact electrodes 17 is enhanced so as to form high-impurity concentration layers 13' and 15' and thus lower the contact resistance.

Figure 8:
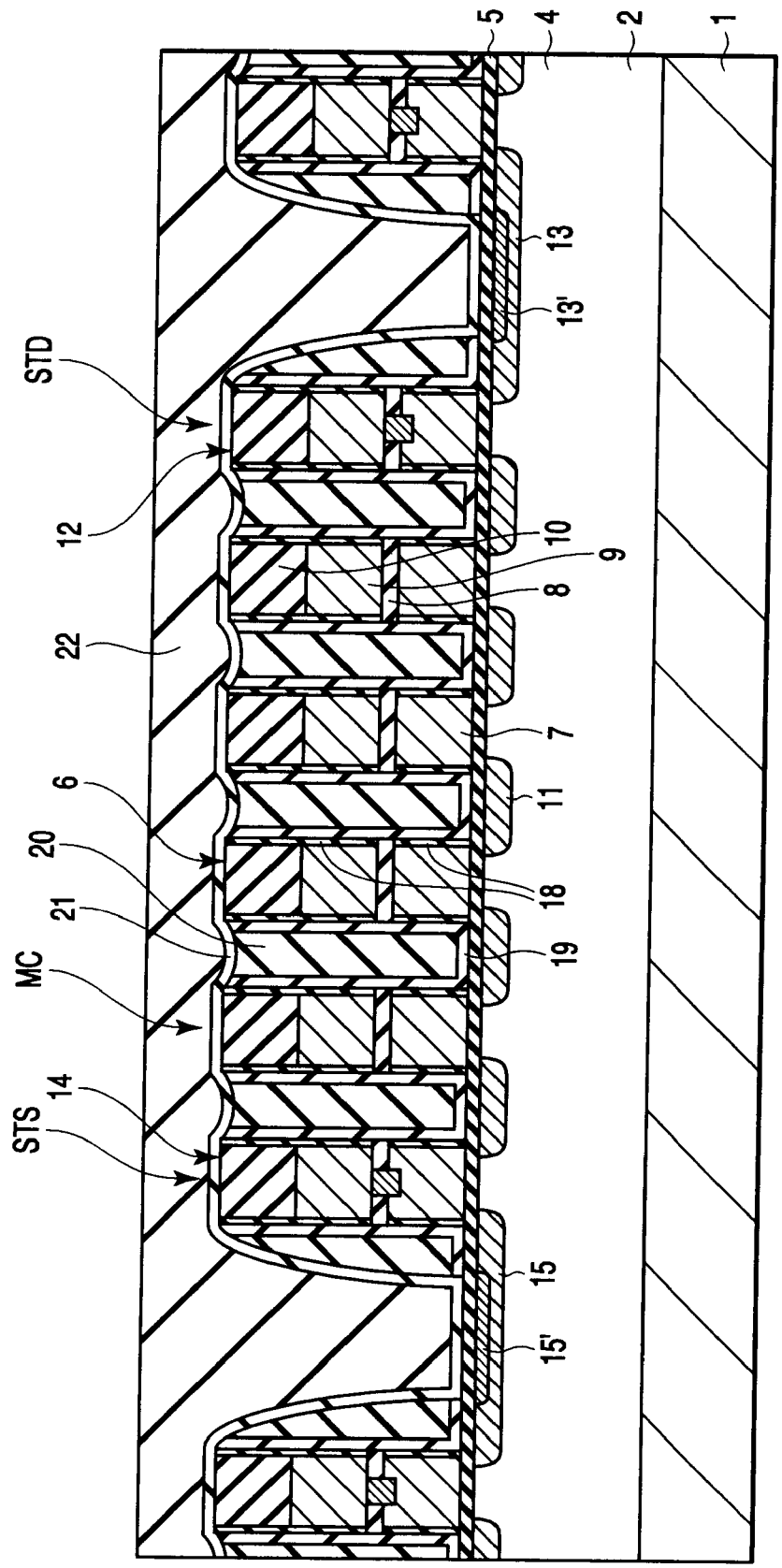
FIG. 8 is a cross sectional view showing an example of a manufacturing step of the NAND type nonvolatile semiconductor memory device according to the first embodiment of this invention.

Next, as shown in FIG. 8, a third insulating film 21 is formed on the surface of the structure shown in FIG. 7, for example, on the first insulating film 19, second insulating film 20, gate electrodes 6, 12, 14, gate insulating film 5 and element isolation region 3 (not shown).

As a material of the third insulating film 21, a material which has a certain selective etching ratio with respect to the element isolation region 3 (not shown) and inter-level insulating film 22 formed in a later step is selected. One example of the material is a silicon nitride and one example of the thickness thereof is approximately 20 nm on the diffusion layer 13 or 15 (high-impurity concentration layer 13' or 15'). Further, one example of the formation process is performed at a temperature of 780° C. and at a film formation speed of 3 nm/min in an atmosphere of $SiH_2Cl_2+NH_3$. In this condition, a silicon nitride film having a hydrogen content of approximately 10 mol % can be attained.

In the table 1, one example of the film formation condition of the first insulating film 19, second insulating film 20 and third insulating film 21 in this example is shown.

TABLE 1

| Film | Film formation atmosphere | Film formation temperature | Film formation speed | Hydrogen content | Electron trap density |
|---|---|---|---|---|---|
| HTO | $SiH_2Cl_2 + N_2O$ | 780° C. | not higher than 0.1 nm/min | not more than 1% | not higher than $10^{18}$/cm$^{-3}$ |
| TEOS | $Si(OC_2H_5)_4$ | not lower than 650° C. not higher than 700° C. | not lower than 2 nm/min not higher than 4 nm/min | more than 1% not more than 10% | higher than $10^{18}$/cm$^{-3}$ not higher than $10^{20}$/cm$^{-3}$ |
| SiN | SiN $SiH_2Cl_2 + NH_3$ | 780° C. | not higher than 3 nm/min | not more than 10% | not higher than $10^{19}$/cm$^{-3}$ |

The charge trap density can be quantitatively derived from the shift amount of flat band voltage of a capacitor.

Further, the hydrogen content can be derived by evaluating the hydrogen concentration in the film by use of secondary ion mass spectroscopy (SIMS) or evaluating an amount of Si—H combinations by use of fourie transform infrared spectroscopy (FTIR).

Next, an inter-level insulating film 22 is deposited on the third insulating film 21. As a material of the inter-level insulating film 22, a material which has a certain selective etching ratio with respect to the third insulating film 21 is selected. One example of the material is a silicon oxide. Then, the surface of the inter-level insulating film 22 is made flat by use of a CMP method, for example. Thus, the inter-level insulating film 22 is filled in between the drain-side selection gate electrodes 12 and between the source-side selection gate electrodes 14.

Figure 9:
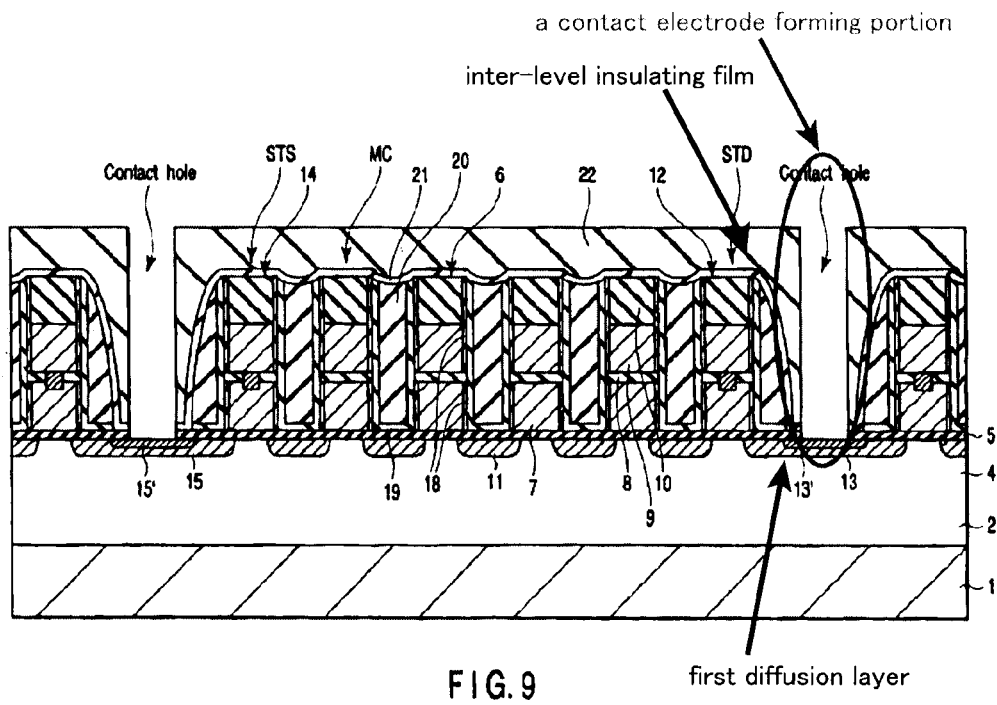
FIG. 9 is a cross sectional view showing an example of a manufacturing step of the NAND type nonvolatile semiconductor memory device according to the first embodiment of this invention.

Next, as shown in FIG. 9, contact holes are formed in the inter-level insulating film 22. The contact holes are formed to reach the diffusion layers 13 and 15 (high-impurity concentration layers 13' and 15'). The etching process for formation of the contact holes is performed to etch the inter-level insulating film 22 by using the etching condition that the inter-level insulating film 22 can be easily etched and the third insulating film 21 is difficult to be etched. Then, the third insulating film 21 and gate insulating film 5 are sequentially etched by using the etching condition that the third insulating film 21 can be easily etched and the element isolation region 3 (not shown) is difficult to be etched. As a result, the diffusion layers 13 and 15 (high-impurity concentration layers 13' and 15') are exposed to the exterior.

Next, as shown in FIG. 2, metal such as aluminum or tungsten or semiconductor of low resistance is filled into the contact holes to form bit line contact electrodes 16 and source line contact electrodes 17. After this, a metal wiring layer is formed on the inter-level insulating film 22 to form bit line connecting portions 23 and source lines 26. Further, a wiring-wiring insulating film 27 is deposited, wiring-wiring contact electrodes 24 are formed and bit lines 25 are formed on the contact electrodes.

Then, an upper wiring layer is formed by use of a method which is generally known to complete the nonvolatile semiconductor memory device according to the first embodiment.

Figure 10:
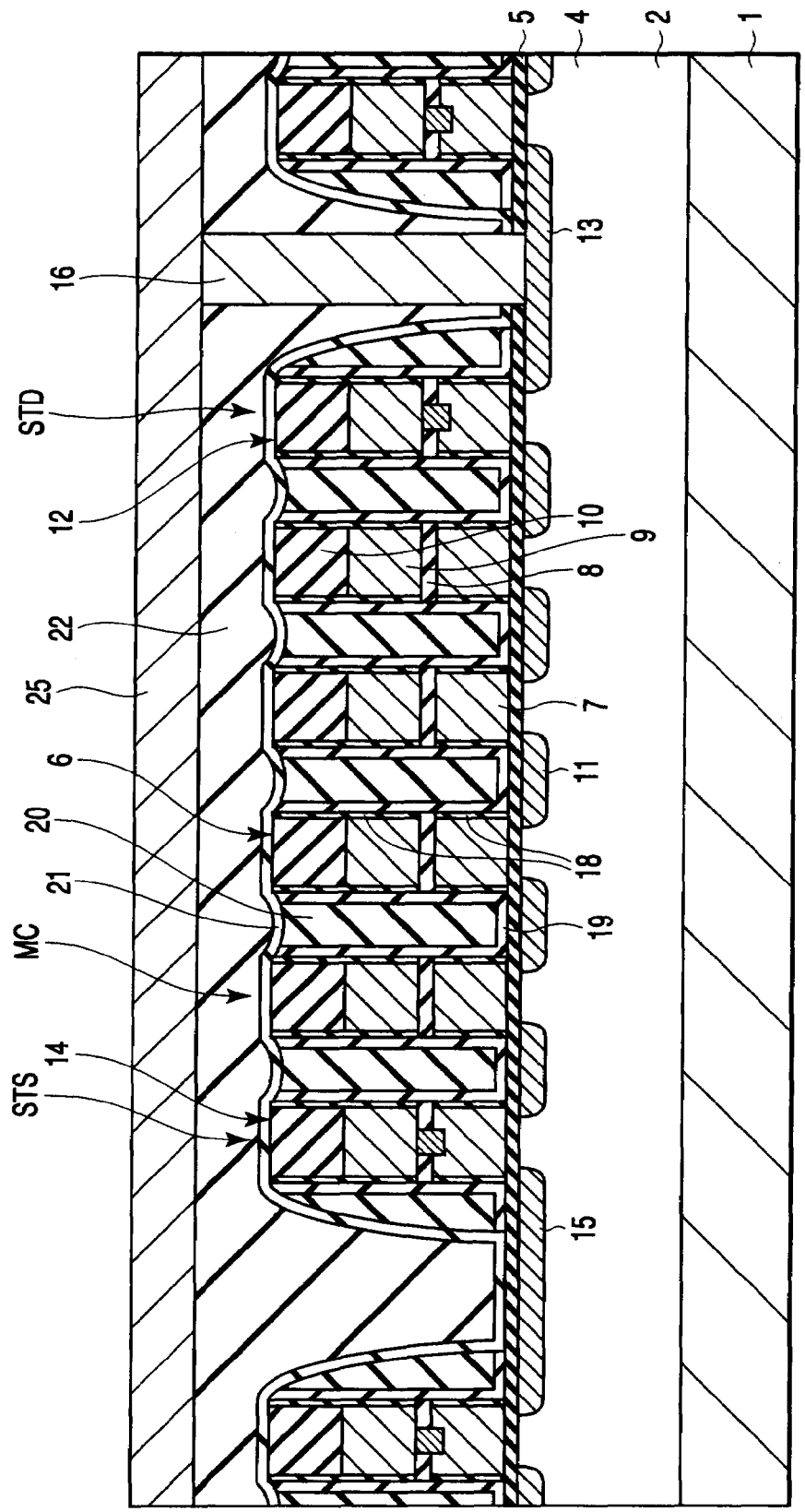
FIG. 10 is a cross sectional view showing an example of the configuration of a NAND type nonvolatile semiconductor memory device according to a modification of the first embodiment of this invention.

The first embodiment is explained based on the structure in which the wiring layers are used as the source lines, but as shown in FIG. 10, the structure can be modified into a structure using the diffusion layers 15 as the source lines without forming the source line contact electrodes 17.

As described above, the charge trap density of the first insulating film 19 and second insulating film 20 can be derived based on the shift amount of the flat band voltage of the capacitor. However, if it is difficult to derive the charge trap density because the memory cell is excessively small, the charge trap density can be predicted as follows.

It is considered that the charge trap density is related to the hydrogen content in the film and particularly to the hydrogen density. That is, in order to derive the charge trap density, the hydrogen densities in the first insulating film 19 and in the second insulating film 20 may be evaluated. As described above, the hydrogen density can be derived by evaluating the hydrogen concentration in the film by use of the SIMS method or evaluating the amount of Si—H combinations by use of the FTIR method. The charge trap density becomes high if the hydrogen concentration is high or the amount of Si—H combinations is large. On the other hand, the charge trap density becomes low if the hydrogen concentration is low or the amount of Si—H combinations is small. By use of the above relation, the charge trap density can be predicted.

Further, for example, the memory cell structure is excessively small and it becomes difficult to determine whether a plurality of layers of insulating films, for example, oxide films are filled in between the gate electrodes simply by observing the cross-sectional SEM photograph in some cases. Even in such a case, it is possible to know that a plurality of layers of insulating films are filled in between the gate electrodes by evaluating the hydrogen density. Some examples of analysis of the insulating films are explained below.

Figure 28:
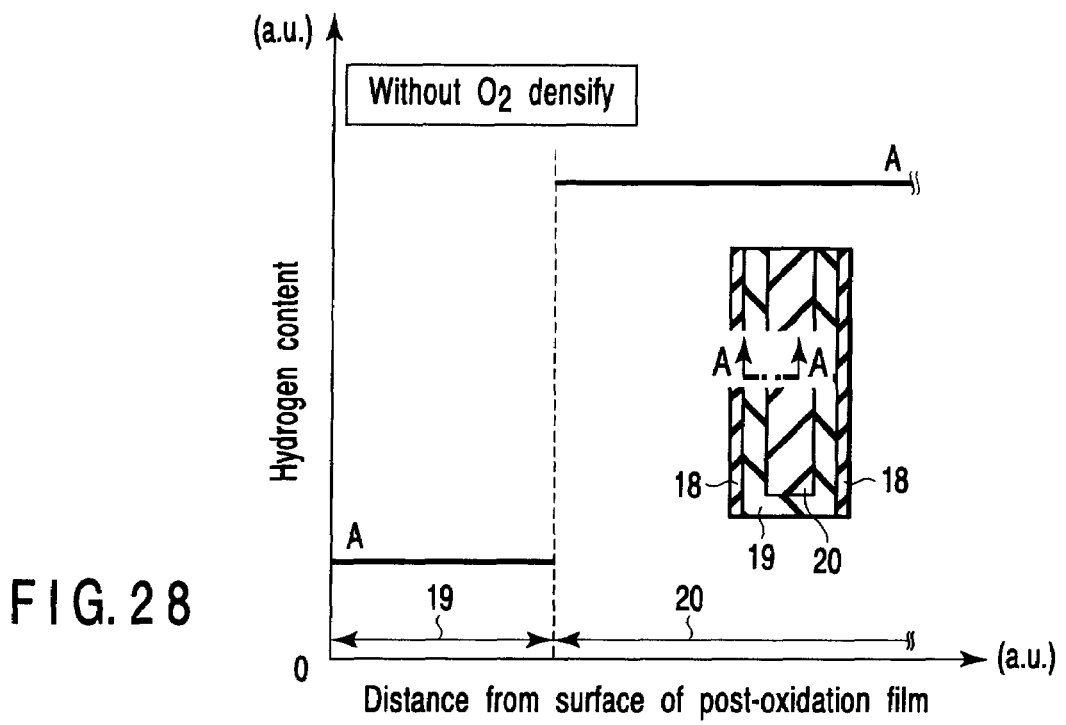
FIG. 28 is a diagram showing a hydrogen profile in a film based on an example of first analysis.

FIG. 28 is a diagram showing a profile of hydrogen in a film based on a first analysis example, the abscissa indicates a distance from the surface of a post-oxidation film and the ordinate indicates the hydrogen content per unit volume. That is, it is the hydrogen density. The profile of hydrogen in the film shown in FIG. 28 is taken along the A-A portion of the cross section of FIG. 28.

As shown in FIG. 28, the hydrogen content is kept low in a range from a portion near the surface of the post-oxidation film 18, that is, the gate electrode to a certain distance and the hydrogen content becomes high on the way and is kept high. If a variation in the hydrogen content can be recognized as shown in FIG. 28 as the result of analysis of the hydrogen content of the oxide film between the gate electrodes, it is possible to know that a plurality of layers of oxide films are filled in between the gate electrodes.

Figure 29:
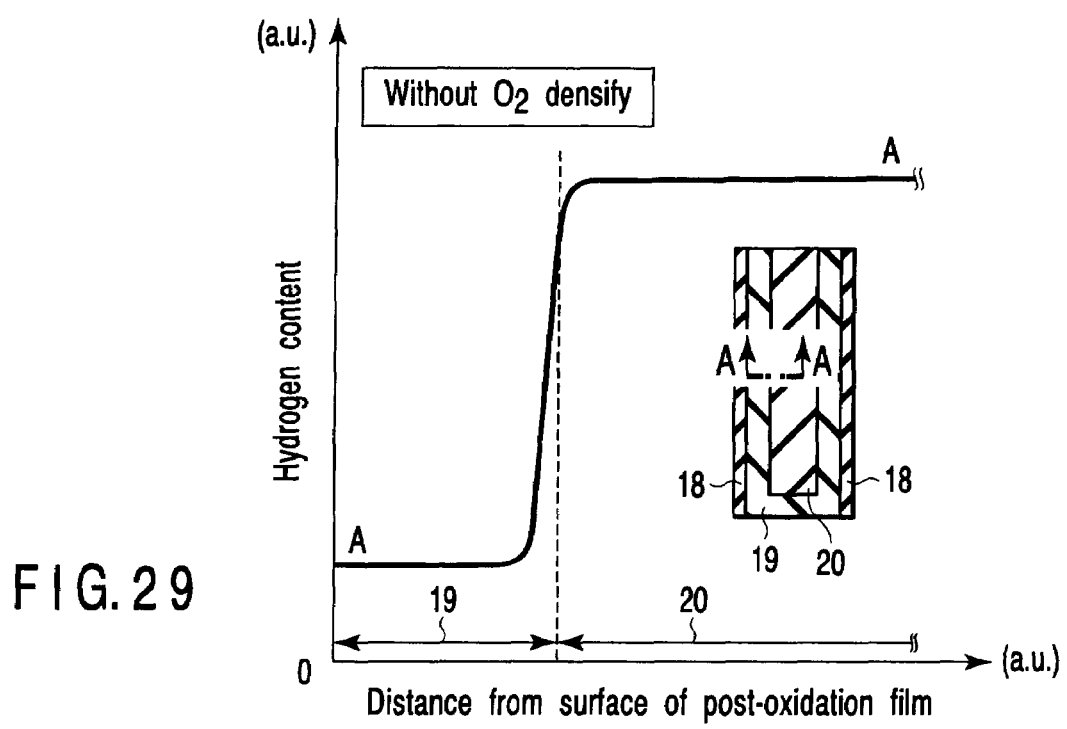
FIG. 29 is a diagram showing a hydrogen profile in a film based on an example second first analysis.

FIG. 29 is a diagram showing a profile of hydrogen in a film based on a second analysis example and is the same diagram as FIG. 28.

The first analysis example shown in FIG. 28 is an example in which it is observed that the hydrogen content non-continuously varies, but the second analysis example is an example in which it is observed that the hydrogen content continuously varies. Even if a continuous variation in the hydrogen content is recognized, it is possible to predict that a plurality of layers of oxide films are filled in between the gate electrodes.

Further, it is understood based on the second analysis example shown in FIG. 29 that the same effect as that of the present embodiment can be attained even when the insulating film, for example, oxide film filled in between the gate electrodes is a single layer if the hydrogen content in a portion near the gate electrode is low and tends to become higher in a portion farther apart from the gate electrode. This is applied to a fourth analysis example which will be described later.

Figure 30:
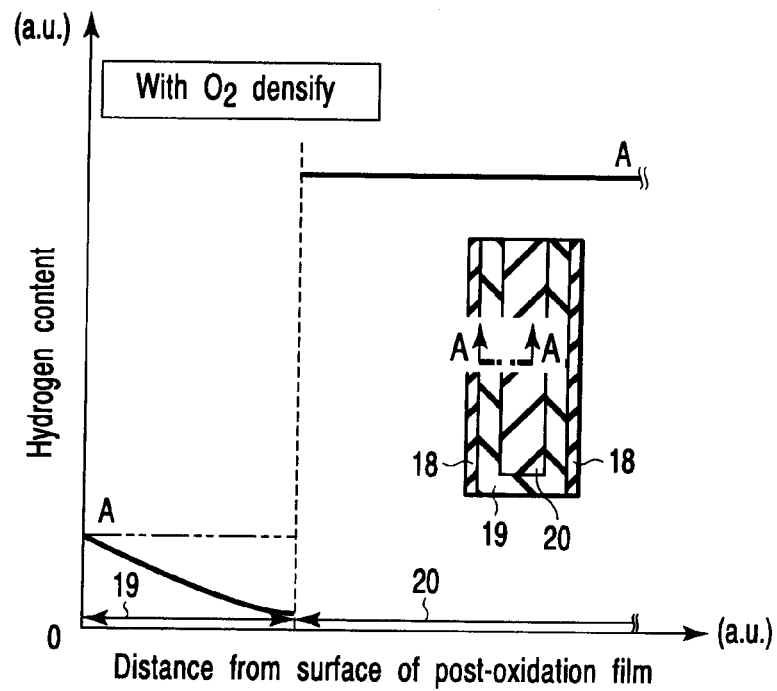
FIG. 30 is a diagram showing a hydrogen profile in a film based on an example of third analysis.

FIG. 30 is a diagram which shows a hydrogen profile in a film based on a third analysis example and is the same diagram as FIG. 28.

The third analysis example is different from the first analysis example in that the first insulating film 19 is processed in the oxidation atmosphere or not (With/Without $O_2$ density).

As described above, if the first insulating film 19 is processed in the oxidation atmosphere, the hydrogen content in the first insulating film 19 can be further reduced. As shown in FIG. 30, it is understood that the hydrogen content is reduced based on the fact that the hydrogen content in the first insulating film 19 tends to be reduced in a portion farther apart from the surface of the post-oxidation film 18. The hydrogen content in the first insulating film 19 processed in the oxidation atmosphere is minimum on the surface thereof and becomes higher in a portion farther apart from the surface. However, the hydrogen content is lower than in a case where the insulating film is not processed in the oxidation atmosphere as indicated by two-dot-dash lines.

In the third analysis example, since the hydrogen content increases in the second insulating film 20, it becomes possible to know that a plurality of layers of insulating films, for example, oxide films are filled in between the gate electrodes.

Figure 31:
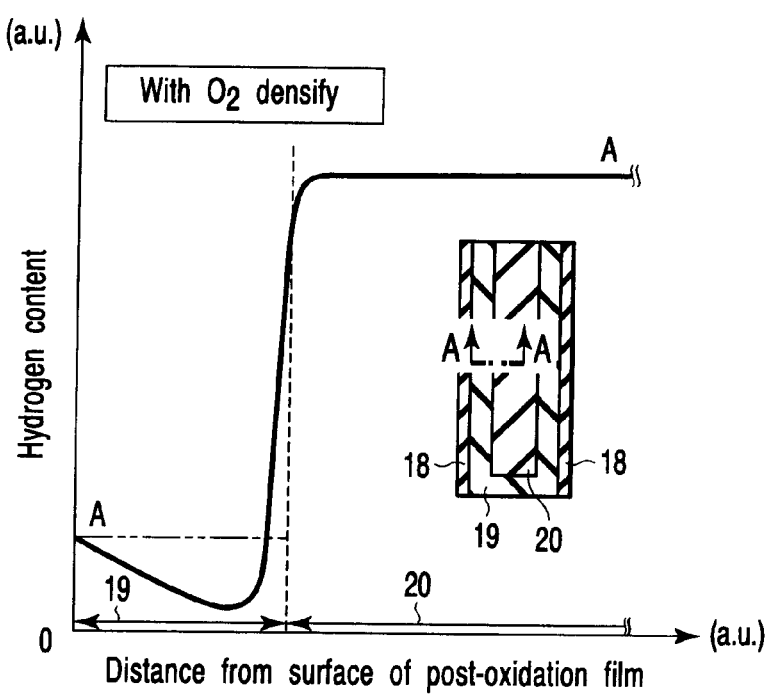
FIG. 31 is a diagram showing a hydrogen profile in a film based on an example of fourth analysis.
Figure 32:
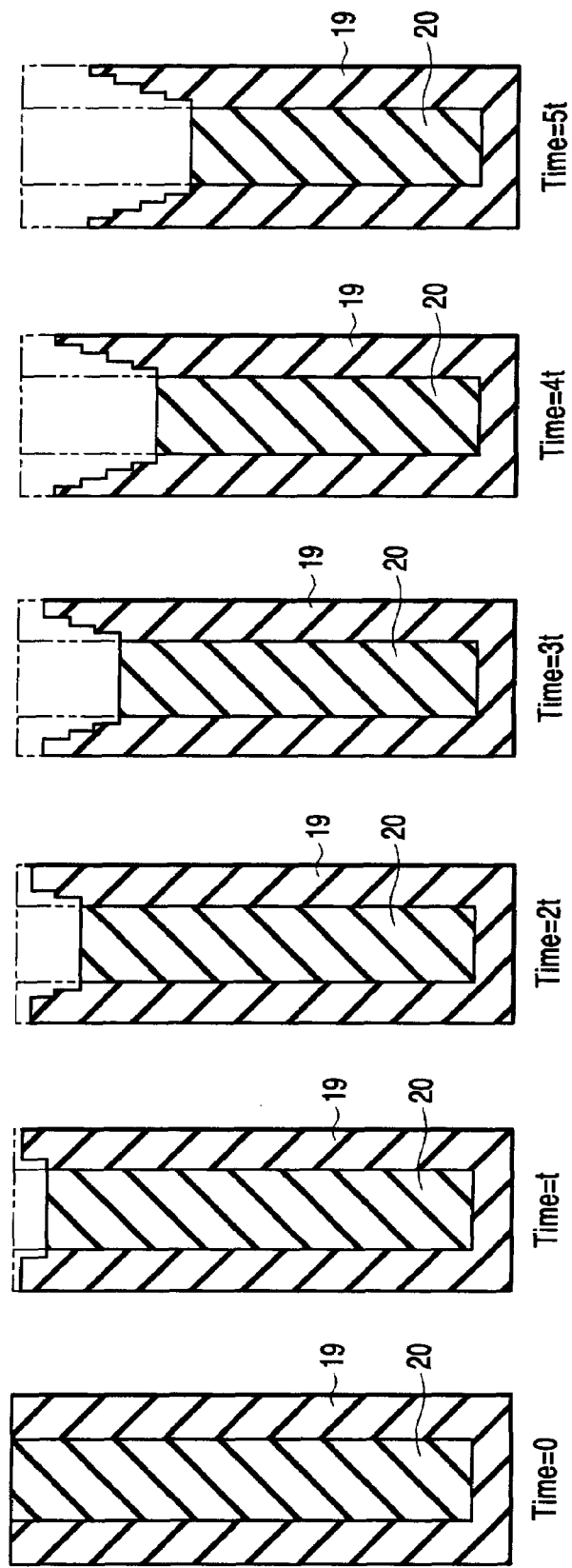
FIGS. 32A to 32F are views showing examples of an etching rate test.
Figure 33:
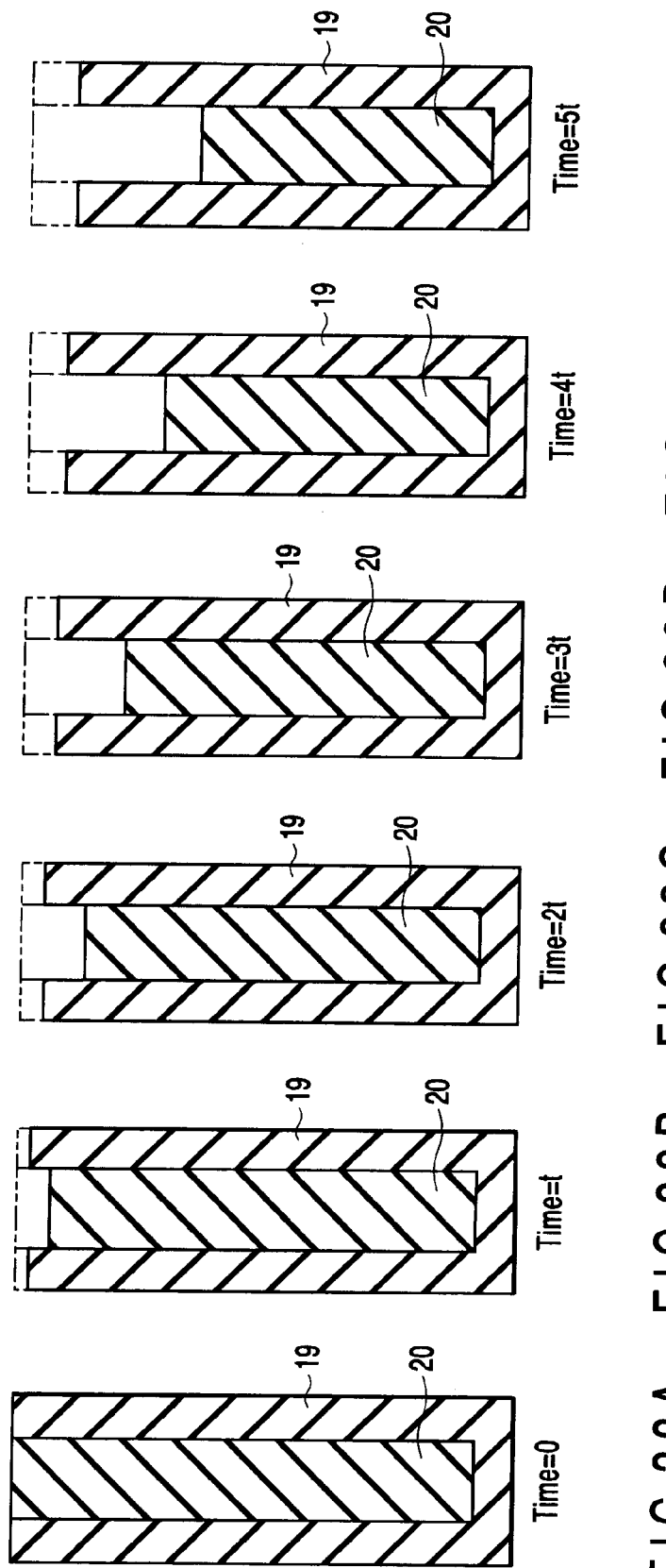
FIGS. 33A to 33F are views showing examples of another etching rate test.

FIG. 31 is a diagram which shows a profile of hydrogen in a film based on an example of fourth analysis and is the same diagram as FIG. 29.

The fourth analysis example is different from the second analysis example in that the first insulating film 19 is processed in the oxidation atmosphere or not. Like the second analysis example, in the fourth analysis example, it is observed that the hydrogen content continuously varies and rapidly increases in the second insulating film 20. Therefore, it is possible to know that a plurality of layers of insulating films, for example, oxide films are filled in between the gate electrodes.

When the SIMS method or FTIR method is used, a certain area is necessary for analysis, and therefore, it is difficult in some cases to measure an infinitesimal area such as the memory cell. In such a case, the amount of Si—H combinations can be predicted by use of the etching rate based on the idea that "the amount of Si—H combinations is smaller in a finer film". For example, a prediction example of the amount of Si—H combinations is described as follows.

When the first insulating film 19 is a silicon oxide film, the film quality of the first insulating film 19 is high since the first insulating film 19 is formed by a process at high temperatures for a long period of time in comparison with the second insulating film 20. One of the indices indicating the film quality is the fineness of the film. One of the indices indicating the fineness of the film is the etching rate. Therefore, the first insulating film 19 and second insulating film 20 are etched at the same time by use of the same etchant. If the first insulating film 19 is finer than the second insulating film 20, the etching rates thereof become different. That is, the etching rate of the first insulating film 19 becomes low and the etching rate of the second insulating film 20 becomes high. In this example, the etching rate of the first insulating film 19 becomes lower than at least twice the etching rate of the second insulating film 20. By use of the difference of the etching rate, the fineness of the film is checked.

Examples of the etching rate test based on the prediction example when the first insulating film 19 and second insulating film 20 are formed of silicon oxide films are shown as follows.

Examples shown in FIGS. 32A to 32F are examples in which an etching process is performed at room temperature by use of a diluted HF solution. They respectively and schematically show the cross sections of the first insulating film 19 and second insulating film 20 which vary with time at every preset time t. The test example is an example in which the first insulating film 19 and second insulating film 20 are subjected to the isotropic etching process by use of a diluted HF solution.

As shown in FIGS. 32A to 32F, the second insulating film 20 is etched to a deeper portion than the first insulating film 19. This is caused by the difference in the etching rate between the first insulating film 19 and the second insulating film 20.

Examples of FIGS. 33A to 33F are made based on the anisotropic etching process, and like FIGS. 32A to 32F, they schematically show the cross sections which vary with time at every preset time t. Like the case of the anisotropic etching process, the second insulating film 20 is etched to a deeper portion than the first insulating film 19 by the difference in the etching rate between the first insulating film 19 and the second insulating film 20.

The cross sections of the first insulating film 19 and the second insulating film 20 shown in FIGS. 32A to 32f and FIGS. 33A to 33F correspond to the cross section shown in FIG. 2. In this case, it is assumed that the etching rate of the first insulating film 19 is approximately ¼ times the etching rate of the second insulating film 20. However, if there is a difference in the etching rate, the second insulating film 20 is etched to a deeper portion than the first insulating film 19 like the above two test examples even when the difference in the etching rate is approximately ½ or ⅓.

Thus, it is possible to selectively remove the second insulating film 20 whose etching rate is higher by approximately two times than that of the first insulating film 19. Based on this fact, it becomes possible to predict that a plurality of layers of insulating films, for example, oxide films are filled in between the gate electrodes.

Second Embodiment

The second embodiment is explained with reference to FIG. 11. The plane pattern of a nonvolatile semiconductor memory device according to the second embodiment is the same as that of the first embodiment. The plan view thereof corresponds to FIG. 1.

Figure 11:
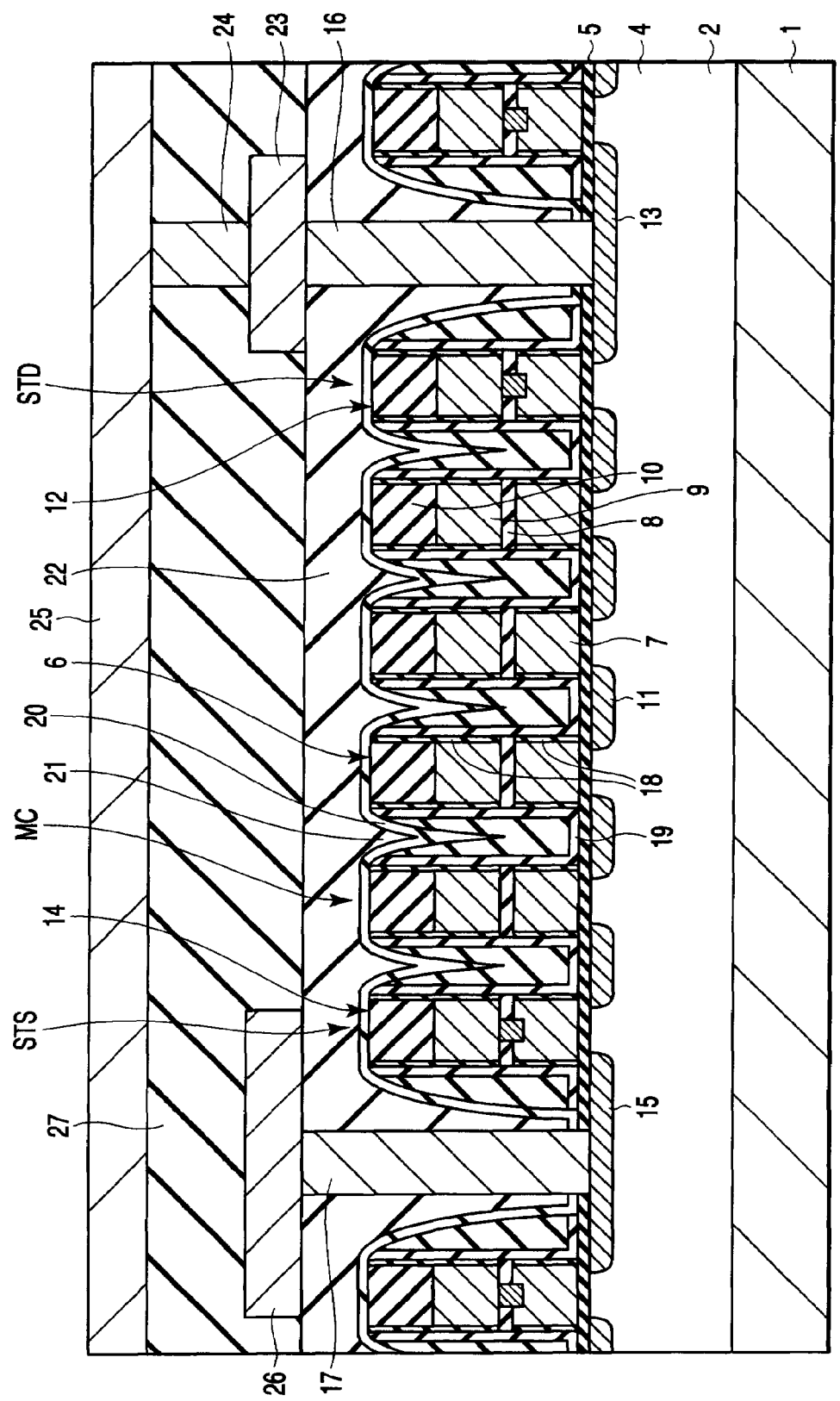
FIG. 11 is a cross sectional view showing an example of the configuration of a NAND type nonvolatile semiconductor memory device according to a second embodiment of this invention.

FIG. 11 is a cross sectional view taken along the A-A line of FIG. 1.

The second embodiment is different from the first embodiment in that a third insulating film 21 is filled to the height of a control gate electrode 9. The other portions are the same as those of the first embodiment, and therefore, the explanation thereof is omitted.

As shown in FIG. 11, in the second embodiment, the third insulating film 21 is filled in each concave portion between memory cell gate electrodes 6 which is caused by forming a second insulating film 20 thinner than that of the first embodiment. At this time, the lowest portion of the filled third insulating film 21 is set higher than the highest portion of a floating gate electrode 7.

The amount of charges trapped on a diffusion layer 11 of each memory cell transistor MC can be further suppressed in comparison with the first embodiment by reducing the film thickness of the second insulating film 21 having a large amount of charge traps in comparison with the first insulating film 19. Therefore, deterioration in the characteristic of the memory cell transistor MC can be prevented.

Third Embodiment

The third embodiment is explained with reference to FIG. 12. The plane pattern of a nonvolatile semiconductor memory device according to the third embodiment is the same as that of the first embodiment. The plan view thereof corresponds to FIG. 1.

Figure 12:
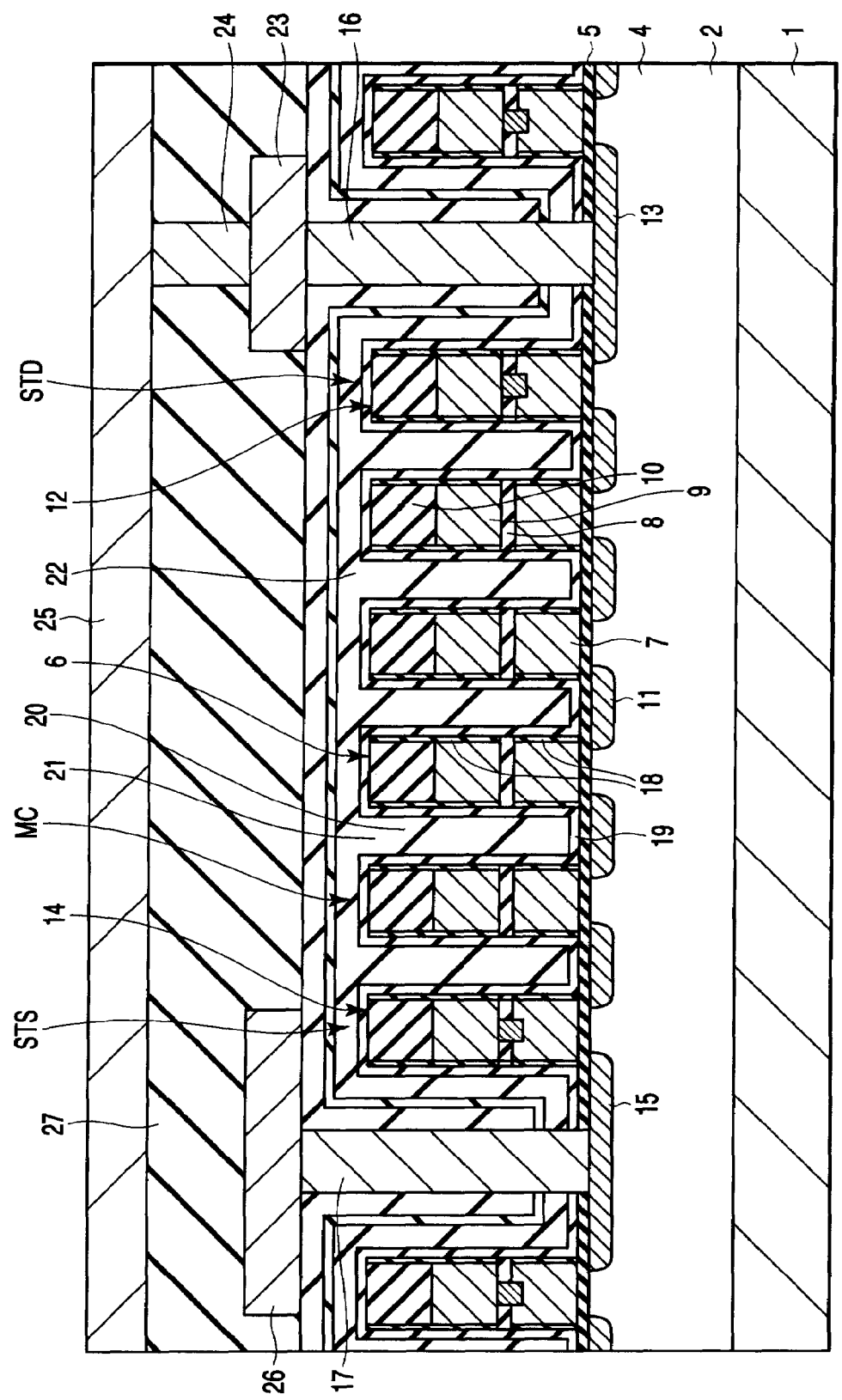
FIG. 12 is a cross sectional view showing an example of the configuration of a NAND type nonvolatile semiconductor memory device according to a third embodiment of this invention.

FIG. 12 is a cross sectional view taken along the A-A line of FIG. 1.

The third embodiment is different from the first embodiment in that a first insulating film 19 and second insulating film 20 are not etched out from the upper surface of a bit line contact diffusion layer 13 and source line contact diffusion layer 15. The other portions are the same as those of the first embodiment, and therefore, the explanation thereof is omitted.

As shown in FIG. 12, in the third embodiment, a third insulating film 21 is deposited after the first insulating film 19 and second insulating film 20 are deposited.

Like the first and second embodiments, the first insulating film 19 and second insulating film 20 are left behind between the memory cell gate electrodes 6 and also left behind on the memory cell gate electrodes 6. Further, the etching process which removes the first insulating film 19 and second insulating film 20 from the upper surfaces of the bit line contact diffusion layer 13 and source line contact diffusion layer 15 is not performed. Therefore, the manufacturing cost can be lowered in comparison with that in the first embodiment.

Like the second embodiment, in the third embodiment, the third insulating film 21 can be filled in between the memory cell gate electrodes 6 so as to be set higher than the highest portion of the floating gate electrode 7.

Fourth Embodiment

The fourth embodiment is explained with reference to FIG. 13. The plane pattern of a nonvolatile semiconductor memory device according to the fourth embodiment is the same as that of the first embodiment. The plan view thereof corresponds to FIG. 1.

Figure 13:
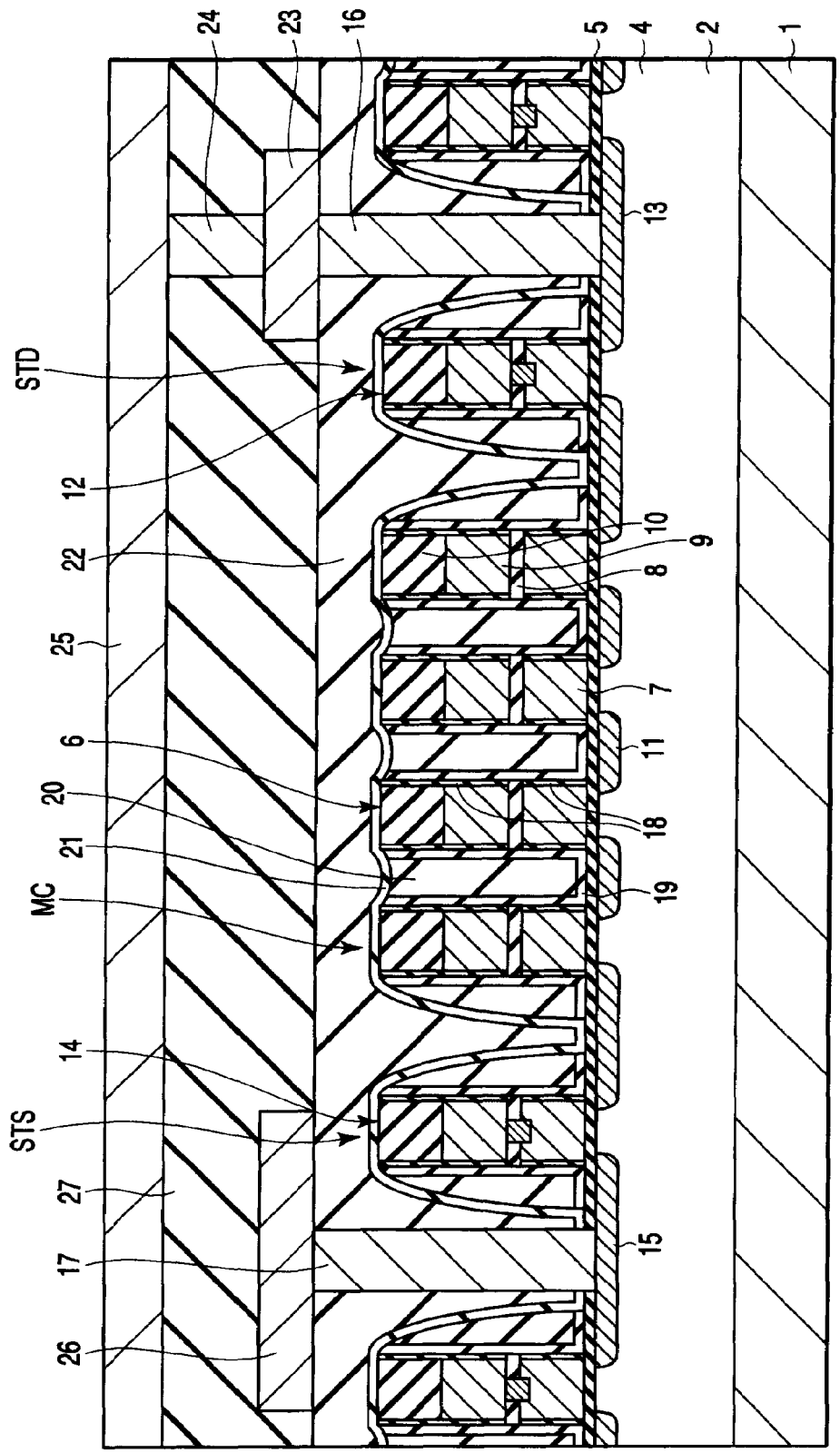
FIG. 13 is a cross sectional view showing an example of the configuration of a NAND type nonvolatile semiconductor memory device according to a fourth embodiment of this invention.

FIG. 13 is a cross sectional view taken along the A-A line of FIG. 1.

In the fourth embodiment, a first insulating film 19 and second insulating film 20 are left behind between memory cell gate electrodes 6. Further, the first insulating film 19 and second insulating film 20 are left behind as side walls on the side surface of the memory cell gate electrode 6 of the source line memory cell transistor MC which is set to face a drain-side selection gate electrode 12 and on the side surface which is set to face a source line selection gate electrode 14. Further, the fourth embodiment is different from the first embodiment in that a third insulating film 21 is filled in between the drain-side selection gate electrode 12 and the memory cell gate electrode 6 and between the source line selection gate electrode 14 and the memory cell gate electrode 6. The other portions are the same as those of the first embodiment, and therefore, the explanation thereof is omitted.

As shown in FIG. 13, in the fourth embodiment, the distance between the drain-side selection gate electrode 12 and the memory cell gate electrode 6 and the distance between the source line selection gate electrode 14 and the memory cell gate electrode 6 are set longer than the distance between the memory cell gate electrodes 6. Further, a third insulating film 21 is filled in between the drain-side selection gate electrode 12 and the memory cell gate electrode 6 and between the source line selection gate electrode 14 and the memory cell gate electrode 6.

Since the distance between the drain-side selection gate electrode 12 and the memory cell gate electrode 6 and the distance between the source line selection gate electrode 14 and the memory cell gate electrode 6 are set longer than the distance between the memory cell gate electrodes 6, the process margin when the gate electrode is patterned by use of the photolithography technology can be enhanced in comparison with the first embodiment. Further, the second insulating film 20 is made thinner than in the first embodiment so as to fill the insulating film in between the memory cell gate electrodes 6 and form concave portions between the drain-side selection gate electrode 12 and the memory cell gate electrode 6 and between the source line selection gate electrode 14 and the memory cell gate electrode 6. As a result, the amount of charges trapped on the diffusion layer of each memory cell transistor can be suppressed in comparison with the first embodiment and deterioration in the characteristic of the memory cell transistor MC can be prevented.

In FIG. 13, the third insulating film 21 is filled in between the drain-side selection gate electrode 12 and the memory cell gate electrode 6 and between the source line selection gate electrode 14 and the memory cell gate electrode 6 to the depth of the gate insulating film 5. The depth of the buried third insulating film 21 can be freely set to depth in portions between the drain-side selection gate electrode 12 and the memory cell gate electrode 6 and between the source line selection gate electrode 14 and the memory cell gate electrode 6.

Further, like the second embodiment, in the fourth embodiment, the structure can be formed in which the third insulating film 21 is filled in between the memory cell gate electrodes 6 so as to be set higher than the highest portion of the floating gate electrode 7.

In addition, like the third embodiment, in the fourth embodiment, the third insulating film 21 can be deposited after the first insulating film 19 and second insulating film 20 are deposited.

Fifth Embodiment

The fifth embodiment is an example in which this invention is applied to a NOR type nonvolatile semiconductor memory device.

Figure 14:
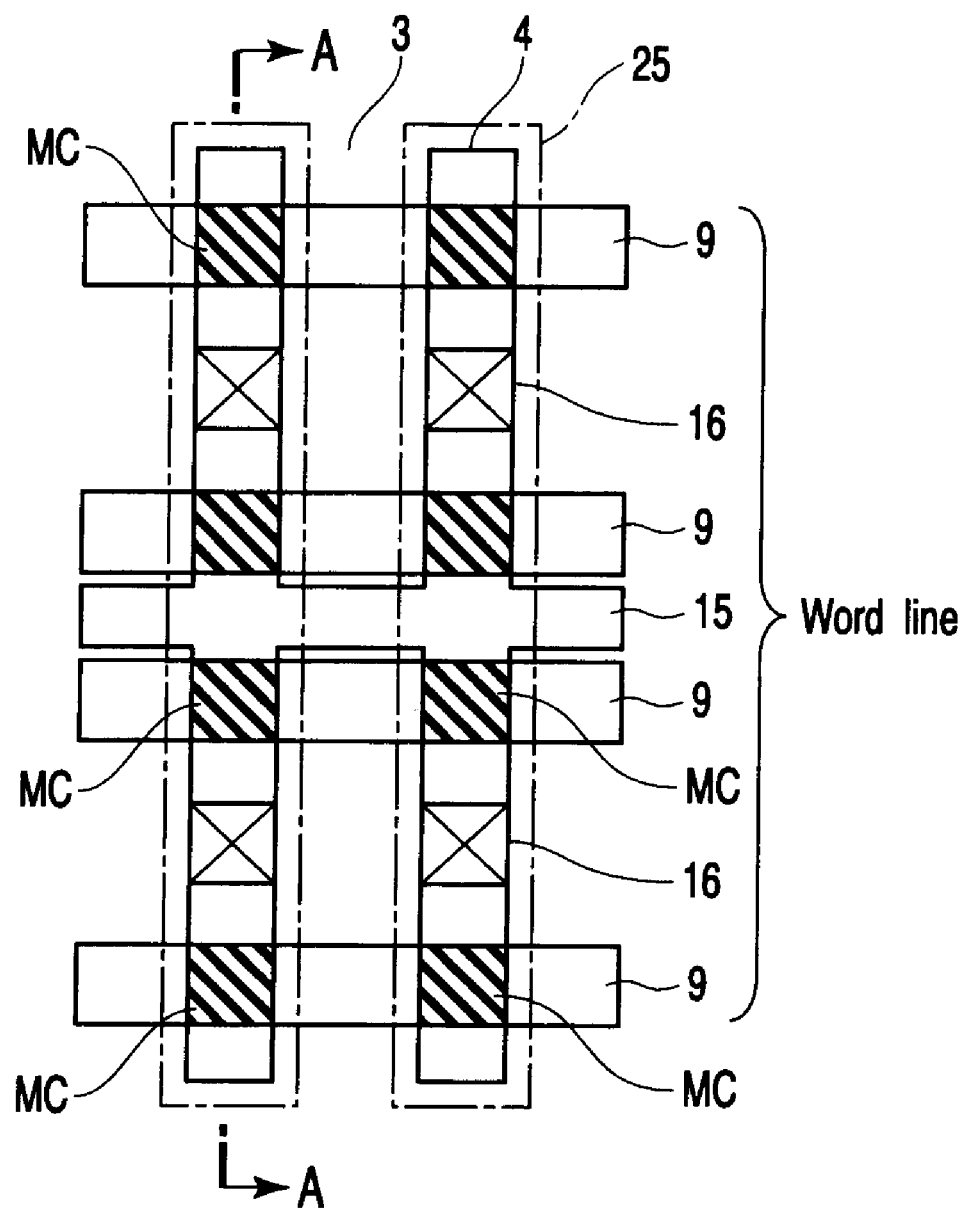
FIG. 14 is a plan view showing an example of the plane pattern of a NOR type nonvolatile semiconductor memory device according to a fifth embodiment of this invention.
Figure 15:
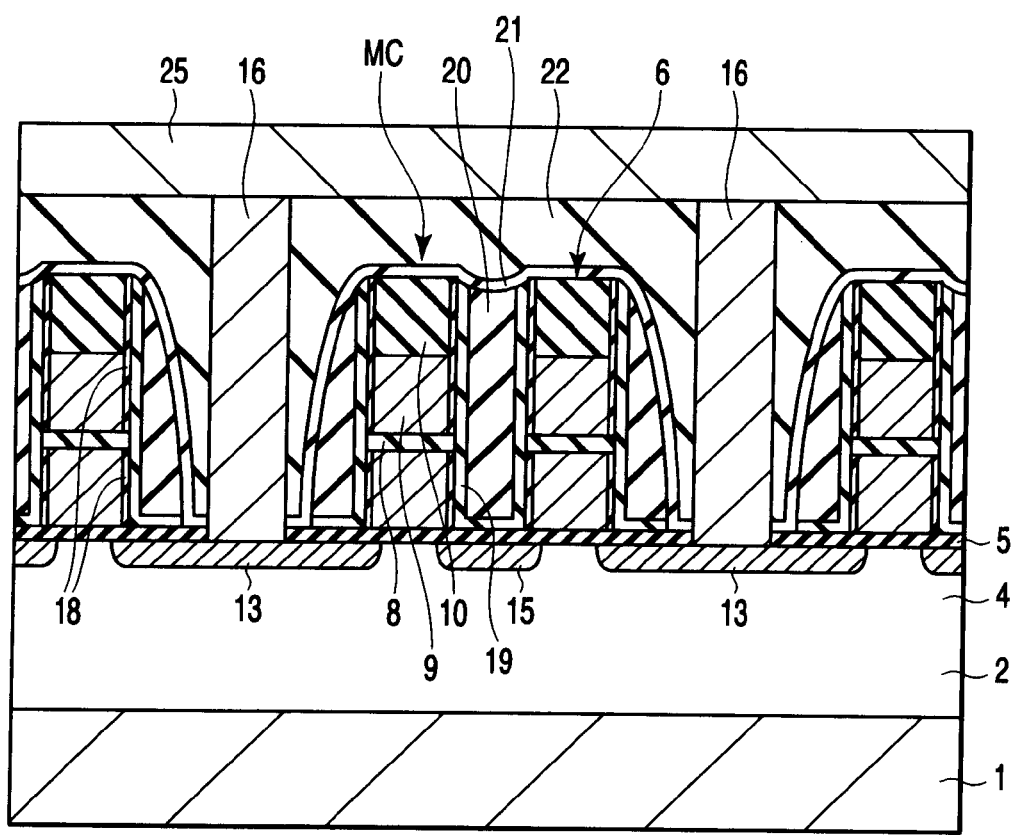
FIG. 15 is a cross sectional view taken along the A-A line of FIG. 14.

FIG. 14 is a plan view showing an example of the plane pattern of the NOR type nonvolatile semiconductor memory device according to the fifth embodiment of this invention and FIG. 15 is a cross sectional view taken along the A-A line of FIG. 14.

As shown in FIGS. 14 and 15, the fifth embodiment is different from the first embodiment in that the number of memory cell transistors MC serially connected between bit line contact electrodes 16 is two and no selection transistors are provided. The other portions are the same as those of the first embodiment, and therefore, the explanation thereof is omitted.

As shown in FIG. 14, in the fifth embodiment, a first insulating film 19 and second insulating film 20 are filled in between the side surfaces of the memory cell gate electrodes 6 which are set on the opposite sides of the bit line contact electrodes 16. Source lines are formed of diffusion layers 15 and the bit line contact electrodes 16 are connected to a bit line 25 formed of a first wiring layer.

Like the second embodiment, in the fifth embodiment, the structure can be formed in which the third insulating film 21 is filled in between the memory cell gate electrodes 6 so as to be set higher than the highest portion of the floating gate electrode 7.

Further, like the third embodiment, in the fifth embodiment, the third insulating film 21 can be deposited after the first insulating film 19 and second insulting film 20 are deposited.

Thus, this invention can be applied not only to the NAND type nonvolatile semiconductor memory device but also to the NOR type nonvolatile semiconductor memory device. Of course, this invention can be applied to an AND type or DiNOR type nonvolatile semiconductor memory device. That is, this invention can be applied to a structure in which a plurality of transistors are serially connected and no contact electrodes are provided between the gate electrodes. Particularly, this invention can be effectively applied to a nonvolatile semiconductor memory device in which contact electrodes having no margin with respect to the element region 4 are provided and a tunnel current is caused to flow through the gate oxide film 5 to apply strong electrical stress to the gate oxide film 5.

Sixth Embodiment

The sixth embodiment is explained with reference to FIG. 16. The plane pattern of a nonvolatile semiconductor memory device according to the sixth embodiment is the same as that of the first embodiment. The plan view thereof corresponds to FIG. 1.

Figure 16:
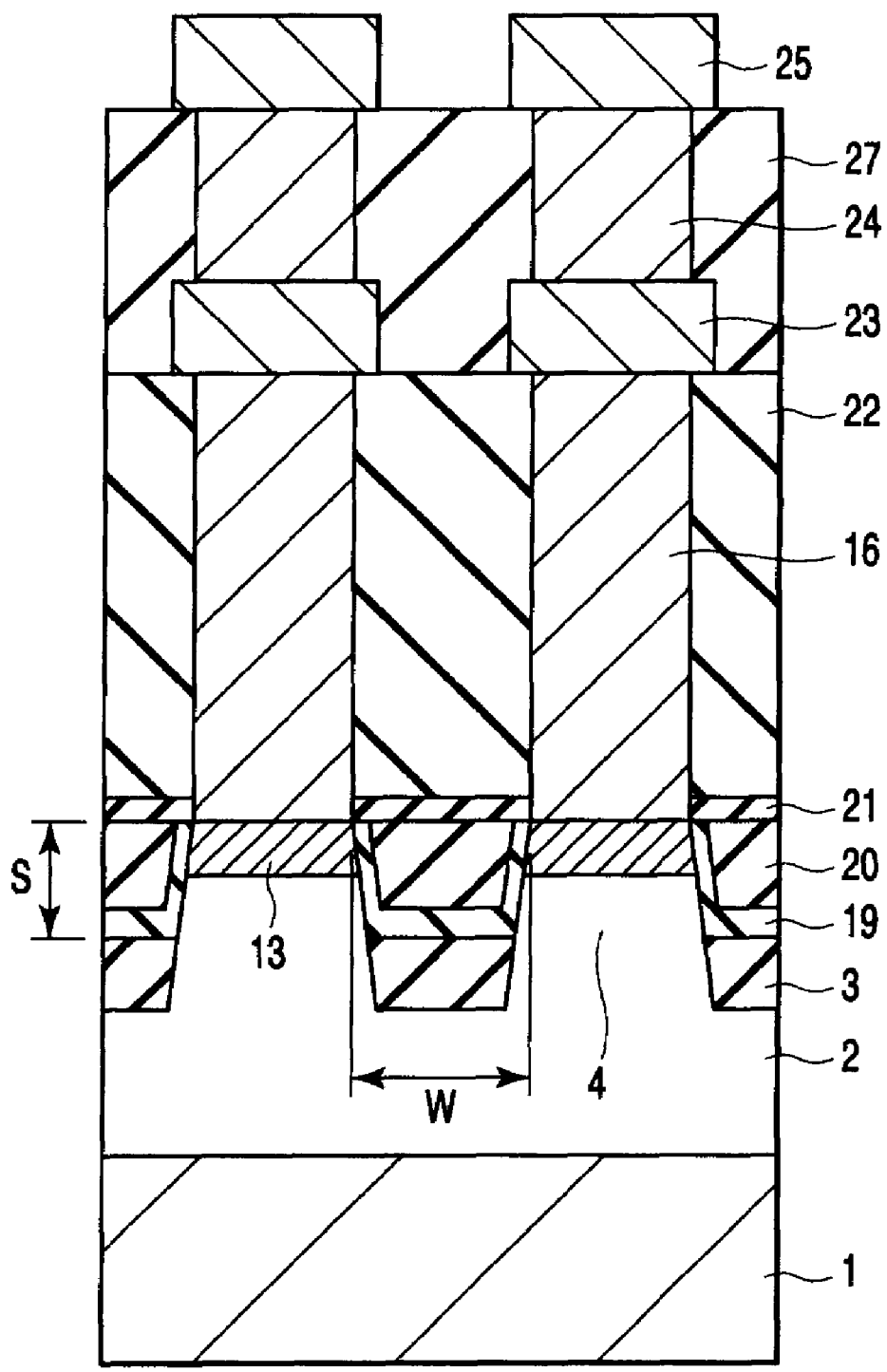
FIG. 16 is a cross sectional view showing an example of the configuration of a NAND type nonvolatile semiconductor memory device according to a sixth embodiment of this invention.
Figure 17:
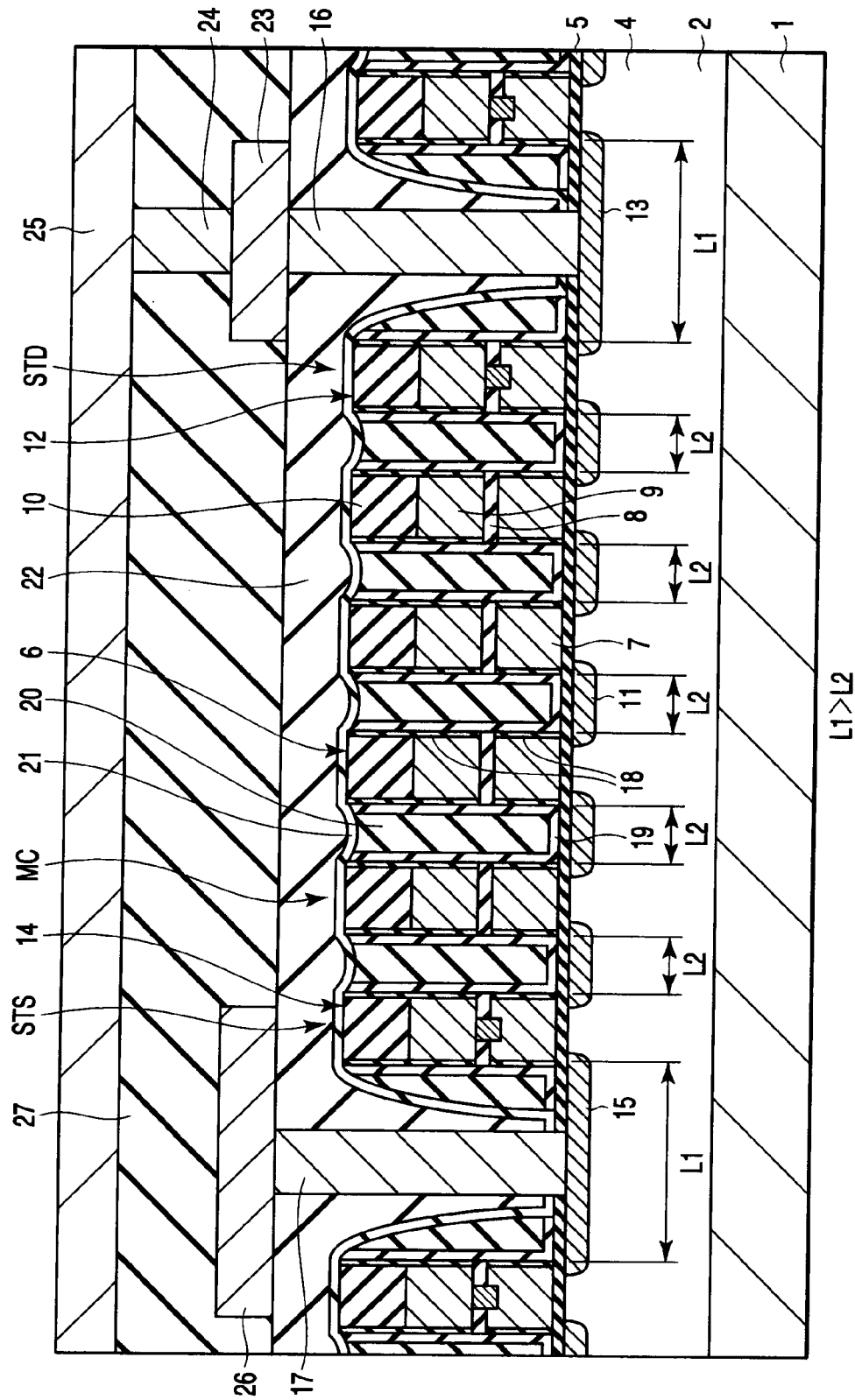
FIG. 17 is a cross sectional view showing distances L1 and L2.

FIG. 16 is a cross sectional view taken along the A-A line of FIG. 1 and FIG. 17 is a cross sectional view showing gate-gate distances L1 and L2.

The sixth embodiment is different from the first embodiment in that a first insulating film 19 and second insulating film 20 are filled in an upper portion of each of element isolating portions of an element isolation region 3. The other portions are the same as those of the first embodiment, and therefore, the explanation thereof is omitted.

As the element is further miniaturized, the process margin when the gate electrodes are etched is lowered. When gate electrodes on element regions 4 are processed into a shape shown in FIG. 2, for example, part of the upper portion of the insulating film filled in the element isolation region 3 may be etched and removed in some cases.

Figure 18:
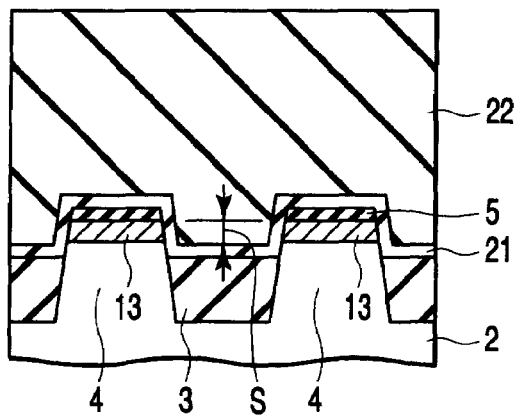
FIG. 18 is a cross sectional view showing an example of a contact hole forming step.

The tendency becomes more significant as the difference between the distance L1 (refer to FIG. 17) between selection gate electrodes 12 or 14 and the distance L2 (refer to FIG. 17) between memory cell gate electrodes 6 becomes larger. That is, a portion of the element isolation region 3 which lies between the selection gate electrodes 12 or 14 tends to be etched due to the etching speed difference caused by the difference in the pattern density. As a result, as shown in FIG. 18, a concave S is formed between the upper surface of the element isolation region 3 and the upper surface of the element region 4. When contact holes are formed in a state in which the concaves S are formed and misalignment occurs, faulty portions occur based on the mechanism shown in FIGS. 19 to 22 even if the third insulating film 21 has been formed.

Figure 19:
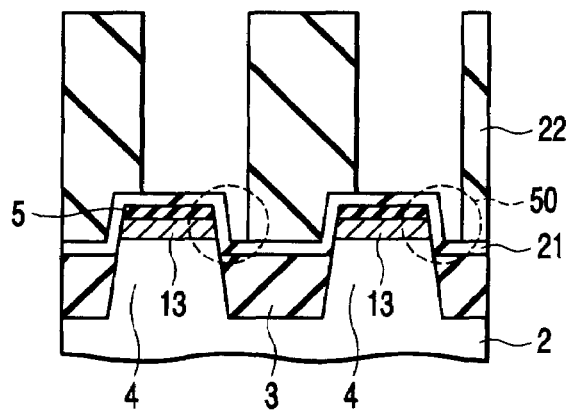
FIG. 19 is a cross sectional view showing an example of a contact hole forming step.

First, as shown in FIG. 19, an inter-level insulating film 22 is etched until the third insulating film 21 is reached. The etching process for the inter-level insulating film 22 is stopped at the third insulating film 21. However, in order to cause etching of the inter-level insulating film 22 to reach the third insulating film 21 in the whole area of the semiconductor wafer which is used form an integrated circuit, an over-etching process is generally performed. For this reason, as indicated by a broken-line circle 50 in FIG. 19, the etching process for the inter-level insulating film 22 proceeds to a portion below the upper surface of the element region 4.

Figure 20:
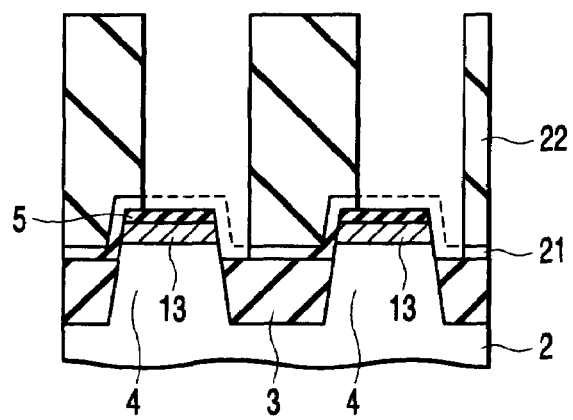
FIG. 20 is a cross sectional view showing an example of a contact hole forming step.

Next, as shown in FIG. 20, the third insulating film 21 is etched. At this time, the third insulating film 21 formed on the side surfaces of the element regions 4 is etched to expose the side surfaces of the element regions 4 to the exterior.

Figure 21:
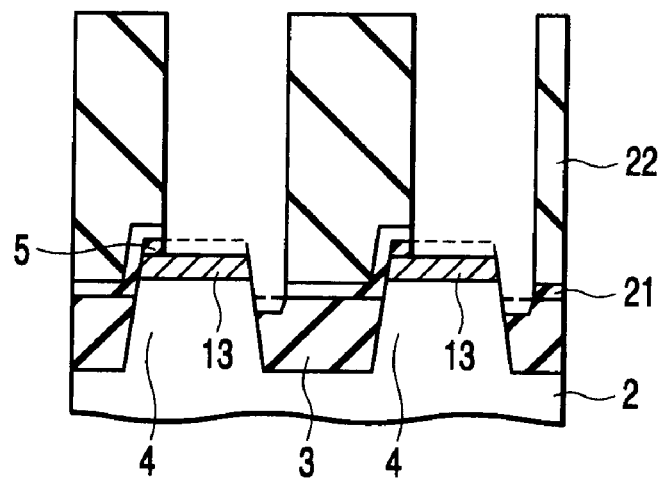
FIG. 21 is a cross sectional view showing an example of a contact hole forming step.

Then, as shown in FIG. 21, the gate insulating film 5 is etched. At this time, if the gate insulating film 5 and an insulating film used as the element isolation region 3 are formed of substantially the same type of material and the element isolation region 3 is exposed to the exterior, the upper portion thereof is partly slightly etched. Therefore, the exposed amount of the side surface of each element region 4 is increased in some cases.

Figure 22:
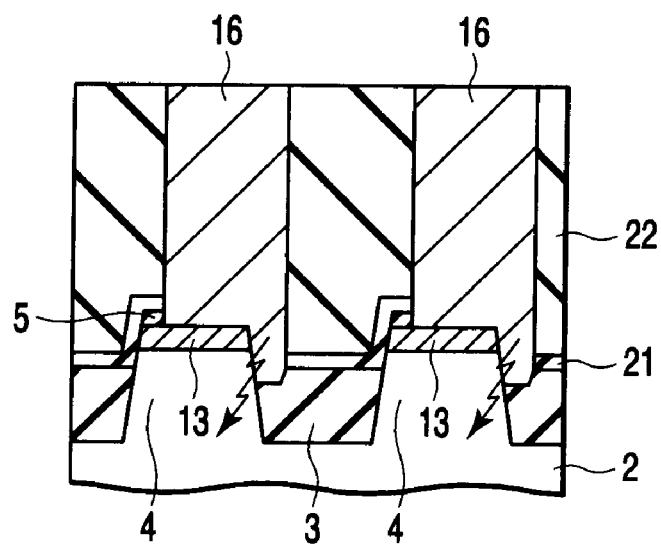
FIG. 22 is a cross sectional view showing an example of a contact hole forming step.

After this, as shown in FIG. 22, contact electrodes 16 are formed in the respective contact holes. Since the side surface of the element region 4 is exposed to the exterior, the contact electrode 16 is brought into contact with not only the diffusion layer 13 but also the element region 4. Therefore, the contact electrode 16 is short-circuited with the element region 4, that is, the bit line is short-circuited with the back-gate of the selection transistor to increase a leak current. If the leak current increases, faulty portions occur. Even when the bit line is not short-circuited with the back-gate of the selection transistor, a junction leak or a lowering in the element isolation withstanding voltage will occur if concaves S are formed.

However, as in the sixth embodiment, in a case where the width W (refer to FIG. 16) of the element isolation trench is equal to or smaller than the distance L2 (L2≧W) between the memory cell gate electrodes 6, it is possible to fill the first insulating film 19 and second insulating film 20 into etched-out portions of the element isolation region 3 adjacent to the contact electrodes 16 or 17 irrespective of the presence of the concaves S when the first insulating film 19 and second insulating film 20 are filled in between the memory cell gate electrodes 6.

That is, as shown in FIG. 16, in the sixth embodiment, the element region 3 is formed in the well 2 on the semiconductor substrate 1 and the element regions 4 isolated by the element isolation region 3 are formed. The bit line contact electrodes 16 are connected to the whole area of the element regions 4. The first insulating films 19 are filled into the upper portions of element isolating portions of the element isolation region 3 and the second insulating films 20 are filled into the internal concave portions of the first insulating films 19 formed in the internal portions of the element isolation region 3. The third insulating film 21 is formed on the first insulating films 19 formed in the element isolation region 3 and on the second insulating films 20. The inter-level insulating film 22 is formed on the third insulating film 21. The bit line contact electrodes 16 are formed to penetrate through the inter-level insulating film 22 and third insulating film 21. The bit line contact electrodes 16 are connected to the respective bit line connecting portions 23 and further connected to the respective bit lines 25 via the wiring-wiring contacts 24. The bit line connecting portions 23 and wiring-wiring contacts 24 are covered with the wiring-wiring insulating film 27.

In this case, the upper surfaces of the first insulating film and second insulating film 20 in the element isolation region 3 are set at the same level as the upper surface of the element region 4. However, they can be set higher than the upper surface of the element region 4.

According to the sixth embodiment, the concaves S formed in the element isolation region 3 are filled with the first insulating film 19 and second insulating film 20 to make the third insulating film 21 flat. Therefore, it becomes possible to prevent step differences from occurring in the third insulating film 21 and occurrence of faults due to the mechanism shown in FIGS. 19 to 22 can be suppressed. Thus, occurrence of the short circuit between the bit line and the back-gate of the selection transistor, occurrence of a junction leak and a lowering in the element isolation withstanding voltage can be suppressed. That is, the process margin for etching to form the contact holes can be enhanced.

Further, since the gaps between the memory cell gate electrodes 6 are filled with the first insulating film 19 and second insulating film 20, deterioration of the electrical characteristics such as a variation in the threshold voltage of the transistors, a lowering in the withstanding voltage in the gate insulating film and the wiring delay of the gate electrode can be prevented.

Next, an example of a contact electrode forming process for a semiconductor integrated circuit device according to the sixth embodiment is explained.

FIGS. 23 to 27 are cross sectional views showing contact electrode forming steps for the semiconductor integrated circuit device according to the sixth embodiment.

Figure 23:
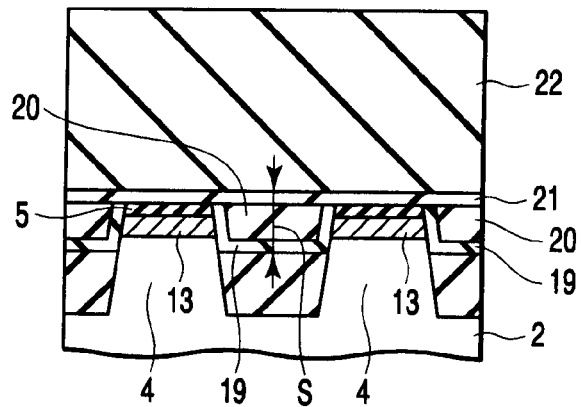
FIG. 23 is a cross sectional view showing an example of a contact hole forming step of the NAND type nonvolatile semiconductor memory device according to the sixth embodiment of this invention.

As shown in FIG. 23, an inter-level insulating film 22 is formed on a third insulating film 21. In the sixth embodiment, since concaves S are filled with a first insulating film 19 and second insulating film 20, the upper surface of the third insulating film 21 is flat.

Figure 24:
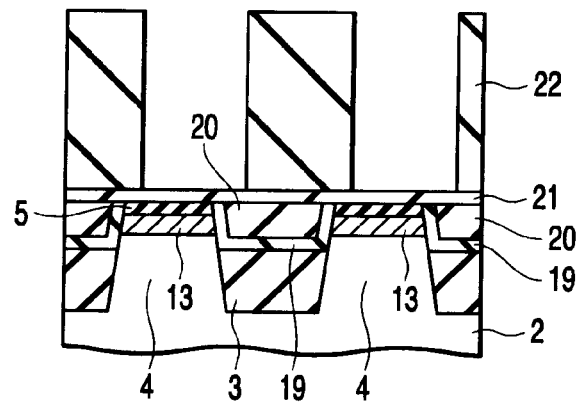
FIG. 24 is a cross sectional view showing an example of a contact hole forming step of the NAND type nonvolatile semiconductor memory device according to the sixth embodiment of this invention.

Next, as shown in FIG. 24, the inter-level insulating film 22 is etched until the third insulating film 21 is reached. The etching process for the inter-level insulating film 22 is stopped at the third insulating film 21. However, since the surface of the third insulating film 21 is flat, a film other than the third insulating film 21 is suppressed from being exposed to the bottom surface of each contact hole. Therefore, an over-etching form as shown in FIG. 19 does not occur.

Figure 25:
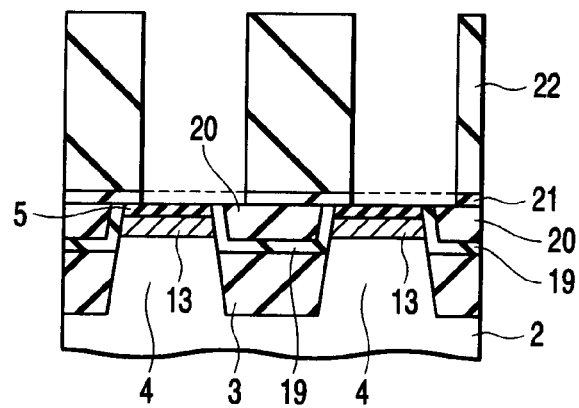
FIG. 25 is a cross sectional view showing an example of a contact hole forming step of the NAND type nonvolatile semiconductor memory device according to the sixth embodiment of this invention.

Then, as shown in FIG. 25, the third insulating film 21 is etched. At this time, the surface of a gate insulating film 5 and the surface of the second insulating film 20 are exposed to the bottom surface of the contact hole. Further, since the first insulating film 19 is formed along the side surface of the element region 4 and the upper surface of the element isolation region 3, the first insulating film 19 is also exposed in a space between the gate insulating film 5 and the second insulating film 20.

Figure 26:
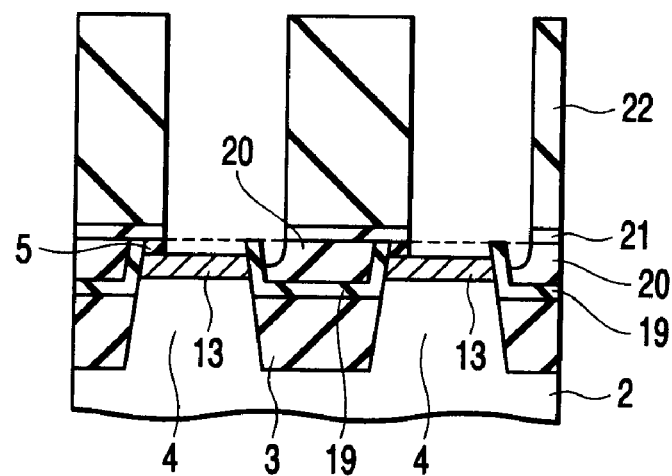
FIG. 26 is a cross sectional view showing an example of a contact hole forming step of the NAND type nonvolatile semiconductor memory device according to the sixth embodiment of this invention.

After this, as shown in FIG. 26, the gate insulating film 5 is etched. At this time, the gate insulating film 5 is formed of substantially the same type of material as the first insulating film 19 and second insulating film 20 and the upper portions of the first insulating film 19 and second insulating film 20 are slightly etched. As a result, the surface of the element region 4 may be exposed in some cases. However, in the sixth embodiment, since the etching process for the concave S does not proceed, the exposing amount of the side surface of the element region 4 is extremely smaller in comparison with a case shown in FIG. 21.

As explained in the first embodiment, if the etching rate of the first insulating film 19 is lower than the etching rate of the second insulating film 20, that is, the first insulating film 19 is more difficult to be etched than the second insulating film 20, the side surface of the element region 4 can be suppressed from being exposed by use of the first insulating film 19 as shown in FIG. 26. Further, it is considered that the film quality of the first insulating film 19 is good if the etching rate of the first insulating film 19 is low. That is, the insulating property of the first insulating film 19 is good.

Figure 27:
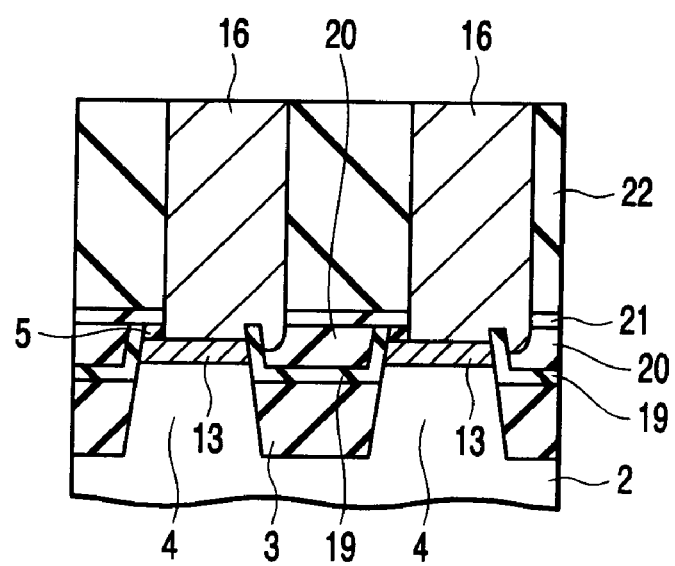
FIG. 27 is a cross sectional view showing an example of a contact hole forming step of the NAND type nonvolatile semiconductor memory device according to the sixth embodiment of this invention.

Therefore, even if the second insulating film 20 is etched early, occurrence of a fault such as a short circuit between a contact region 16 and the element region 4 occurring when the contact region 16 is formed in each contact hole can be more effectively suppressed by use of the first insulating film 19 as shown in FIG. 27.

In the sixth embodiment, the explanation is made by placing emphasis on the surrounding portion of each bit line contact electrode 16, but the same explanation can be made for the surrounding portion of each source line contact electrode 17.

Further, the semiconductor integrated circuit device according to the embodiments of this invention has the following factors.

(1) The semiconductor integrated circuit device includes a semiconductor substrate, first gate electrodes formed above the semiconductor substrate, second gate electrodes formed above the semiconductor substrate, first diffusion layers which are each formed in the semiconductor substrate below one of the side surfaces of the first gate electrode, second diffusion layers which are each formed in a portion of the semiconductor substrate which lies between a portion lying below the other side surface of the first gate electrode and a portion lying below one of the side surfaces of the second gate electrode, contact electrodes electrically connected to the first diffusion layers, a first insulating film which has a shape having concaves between the first gate electrodes and the second gate electrodes and does not contain nitrogen as a main component, a second insulating film which is formed on the first insulating film and does not contain nitrogen as a main component, a third insulating film formed on the first diffusion layers, first gate electrodes, second diffusion layers and second gate electrodes with the second insulating film disposed therebetween in at least a partial region, and an inter-level insulating film formed on the third insulating film and containing a main component different from that of the third insulating film. The position of the lowest portion of the third insulating film which lies on the second diffusion layer is set higher than the position of the lowest portion of a portion which is formed in contact with the contact electrode on the first diffusion layer. The second insulating film is formed to fill in the concaves and a portion between the first and second gate electrodes has a multi-layered structure containing at least the first and second insulating films.

(2) In the semiconductor integrated circuit device of (1), the width of the first diffusion layer is larger than the width of the second diffusion layer.

(3) The semiconductor integrated circuit device includes a semiconductor substrate, a first cell unit which includes a memory cell transistor train containing at least one memory cell transistor having a gate electrode and formed on the semiconductor substrate and a selection transistor formed on the semiconductor substrate, arranged adjacent to one end of the memory cell transistor train and having a gate electrode, a second cell unit which includes a memory cell transistor train containing at least one memory cell transistor having a gate electrode and formed on the semiconductor substrate and a selection transistor formed on the semiconductor substrate, arranged adjacent to one end of the memory cell transistor train and having a gate electrode, diffusion layers formed in the semiconductor substrate between one of the selection transistor and memory cell transistor of the first cell unit and one of the selection transistor and memory cell transistor of the second cell unit, contact electrodes electrically connected to the diffusion layers, a first insulating film which is formed into a shape to have at least one concave portion between the gate electrodes of the first and second cell units and does not contain nitrogen as a main component, a second insulating film which is formed on the first insulating film and does not contain nitrogen as a main component, a third insulating film formed between the gate electrodes of the first cell unit and between the gate electrodes of the second cell unit on the first cell unit, second cell unit and diffusion layers with the first and second insulating films disposed there-between, and an inter-level insulating film formed on the third insulating film and containing a main component different from that of the third insulating film. The position of the lowest portion of the third insulating film which lies between the gate electrodes is set higher than the position of the lowest portion of a portion which is formed in contact with the contact electrode on the diffusion layer. The second insulating film is formed to fill in the concave portion. Further, portions between the gate electrodes of the first cell unit and between the gate electrodes of the second cell unit have a multi-layered structure which contains at least the first and second insulating films.

(4) In the semiconductor integrated circuit device according to one of (1) to (3), the gate electrode of the memory cell transistor is a stacked gate electrode containing a floating gate and control gate and the position of the lowest portion of the third insulating film which lies between the stacked gate electrodes is set higher than the position of the highest portion of the control gate.

(5) In the semiconductor integrated circuit device according to one of (1) to (3), the gate electrode of the memory cell transistor is a stacked gate electrode containing a floating gate and control gate and the position of the lowest portion of the third insulating film which lies between the stacked gate electrodes is set higher than the position of the highest portion of the floating gate.

(6) In the semiconductor integrated circuit device according to one of (1) to (5), the distance between the gate electrodes in each of the first and second cell units is shorter than the distance between the gate electrode of the first cell unit and the gate electrode of the second cell unit.

(7) In the semiconductor integrated circuit device according to one of (1) to (6), the sum of the film thickness of the first insulating film formed on the side surface of the gate electrode which faces the contact electrode in a direction along the surface of the semiconductor substrate and the film thickness of the second insulating film formed on the side surface which faces the contact electrode in a direction along the surface of the semiconductor substrate is not smaller than half the distance between the gate electrodes.

(8) In the semiconductor integrated circuit device according to one of (1) to (7), the semiconductor substrate includes element regions and an element isolation region formed along the element regions and including a fourth insulating film, the first cell unit, diffusion layers and second cell unit are formed on the element regions, the fourth insulating film has concave portions adjacent to the diffusion layers, and the first and second insulating films are formed in the concave portions of the fourth insulating film.

(9) In the semiconductor integrated circuit device according to (8), the width of the element isolation region in direction perpendicular to a direction in which the element isolation region is formed along the element regions is smaller than the distance between the gate electrodes.

(10) In the semiconductor integrated circuit device according to one of (1) to (9), the dielectric constant of the first and second insulating films is smaller than the dielectric constant of the third insulating film.

(11) In the semiconductor integrated circuit device according to one of (1) to (10), the charge trap density in the first insulating film is lower than the charge trap density in the second insulating film.

(12) In the semiconductor integrated circuit device according to one of (1) to (11), the density of hydrogen contained in the first insulating film is lower than the density of hydrogen contained in the second insulating film.

(13) In the semiconductor integrated circuit device according to one of (1) to (12), the etching rate of the first insulating film is lower than the etching rate of the second insulating film.

(14) In the semiconductor integrated circuit device according to one of (1) to (13), the first and second insulating films are silicon oxide films.

(15) In the semiconductor integrated circuit device according to one of (1) to (14), the third insulating film is a silicon nitride film.

(16) A manufacturing method of a semiconductor integrated circuit device includes forming first and second gate electrodes on a semiconductor substrate, doping impurity into the semiconductor substrate with the first and second gate electrodes used as a mask, forming first and second diffusion layers in the semiconductor substrate, forming a first insulating film which does not contain nitrogen as a main component and has concave portions between the first and second gate electrodes on the first and second diffusion layers and first and second gate electrodes, forming a second insulating film which does not contain nitrogen as a main component on the first insulating film to fill the concave portions between the first and second gate electrodes, forming a third insulating film on the second insulating film, forming an inter-level insulating film having a main component different from that of the third insulating film on the third insulating film, etching a portion of the inter-level insulating film which lies on contact electrode forming portions of the first diffusion layers to form contact holes, and forming contact electrodes electrically connected to the respective diffusion layers in the contact holes.

(17) A manufacturing method of a semiconductor integrated circuit device includes forming a first cell unit gate electrode group containing a gate electrode of at least one first memory cell transistor and a gate electrode of a first selection transistor adjacent to the above gate electrode and a second cell unit gate electrode group arranged adjacent to the first cell unit gate electrode group and containing a gate electrode of at least one second memory cell transistor and a gate electrode of a second selection transistor adjacent to the above gate electrode on a semiconductor substrate, doping impurity into the semiconductor substrate with the first and second cell unit gate electrode groups used as a mask, forming a plurality of diffusion layers in the semiconductor substrate, forming a first insulating film which does not contain nitrogen as a main component and has concave portions between the gate electrodes on the plurality of diffusion layers and first and second cell unit gate electrode groups, forming a second insulating film which does not contain nitrogen as a main component on the first insulating film to fill the concave portions between the gate electrodes in the first and second cell unit gate electrode groups, forming a third insulating film on the second insulating film, forming an inter-level insulating film having a main component different from that of the third insulating film on the third insulating film, etching a portion of the inter-level insulating film which lies on contact electrode forming portions of the diffusion layers between the first and second cell unit gate electrode groups to form contact holes, and forming contact electrodes electrically connected to the first diffusion layers in the contact holes.

(18) In the manufacturing method of the semiconductor integrated circuit device according to one of (16) and (17), the first insulating film is processed in an oxidation atmosphere after the first insulating film was formed.

(19) In the manufacturing method of the semiconductor integrated circuit device according to one of (16) and (18), the film formation speed of the first insulating film is lower than the film formation speed of the second insulating film.

According to the embodiments of this invention, a semiconductor integrated circuit device is provided which is suitable for miniaturization and in which deterioration in the characteristic of the transistor, a variation in the threshold voltage and an increase in the wiring delay can be suppressed.

This invention has been explained by use of a plurality of embodiments, but this invention is not limited to the above embodiments. This invention can be variously modified without departing from the technical scope thereof.

For example, in each of the above embodiments, no problems occur even if cavities are formed in the second insulating film which fills in between the memory cell gate electrodes 6, between the memory cell gate electrode 6 and the drain-side selection gate electrode 12 and between the memory cell gate electrode 6 and the source-side selection gate electrode 14. If the upper surface of the film is closed even when the cavities are formed, the third insulating film 21 will not be further filled from the position specified in each embodiment. Thus, the same advantage can be attained in each embodiment.

Further, the above embodiments are explained by using an example of the NAND or NOR type nonvolatile semiconductor memory device. However, this invention can be applied to a nonvolatile semiconductor memory device other than the NAND or NOR type nonvolatile semiconductor memory device.

Figure 34:
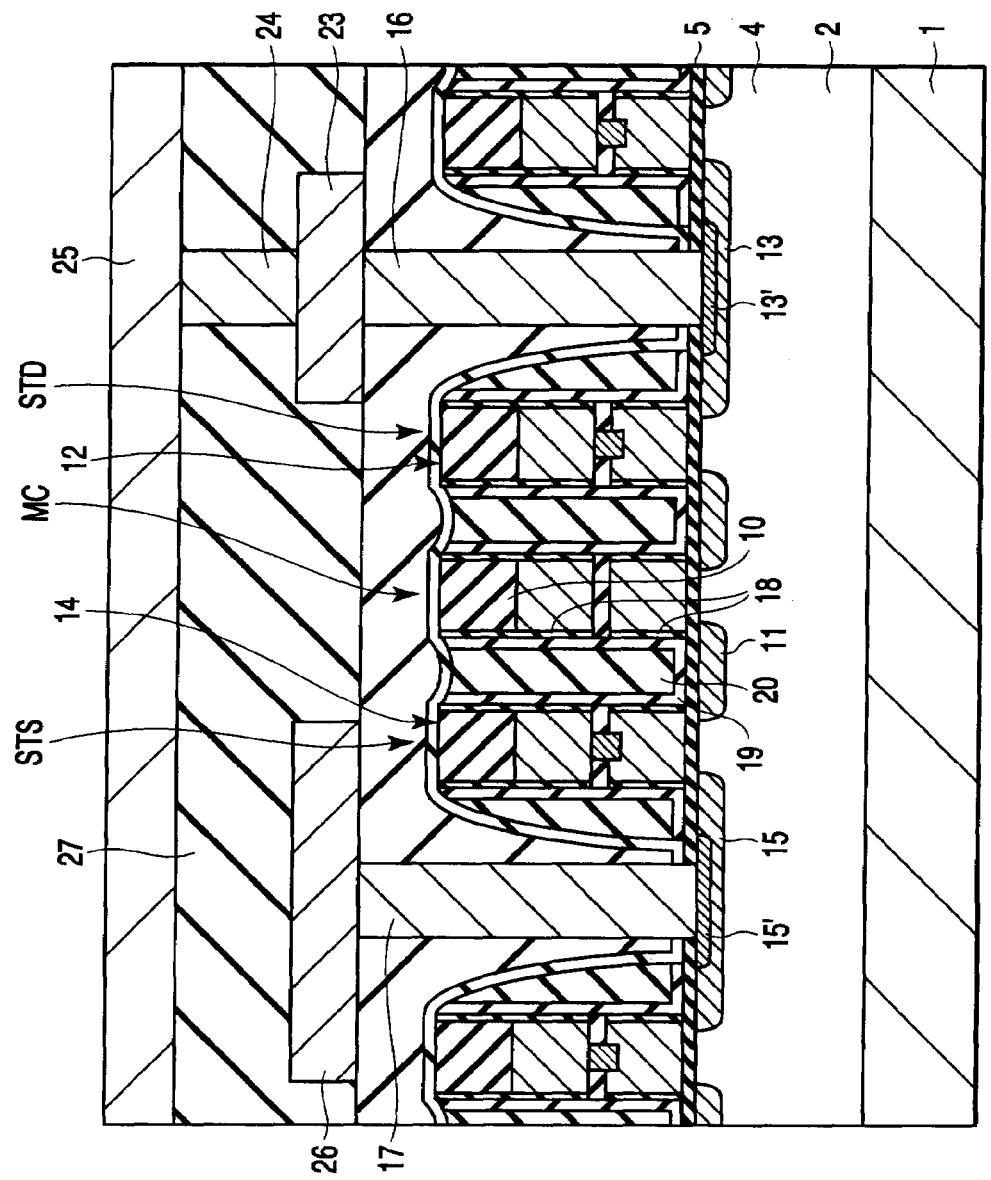
FIG. 34 is a cross sectional view showing an example of a transistor cell type nonvolatile semiconductor memory device.
Figure 35:
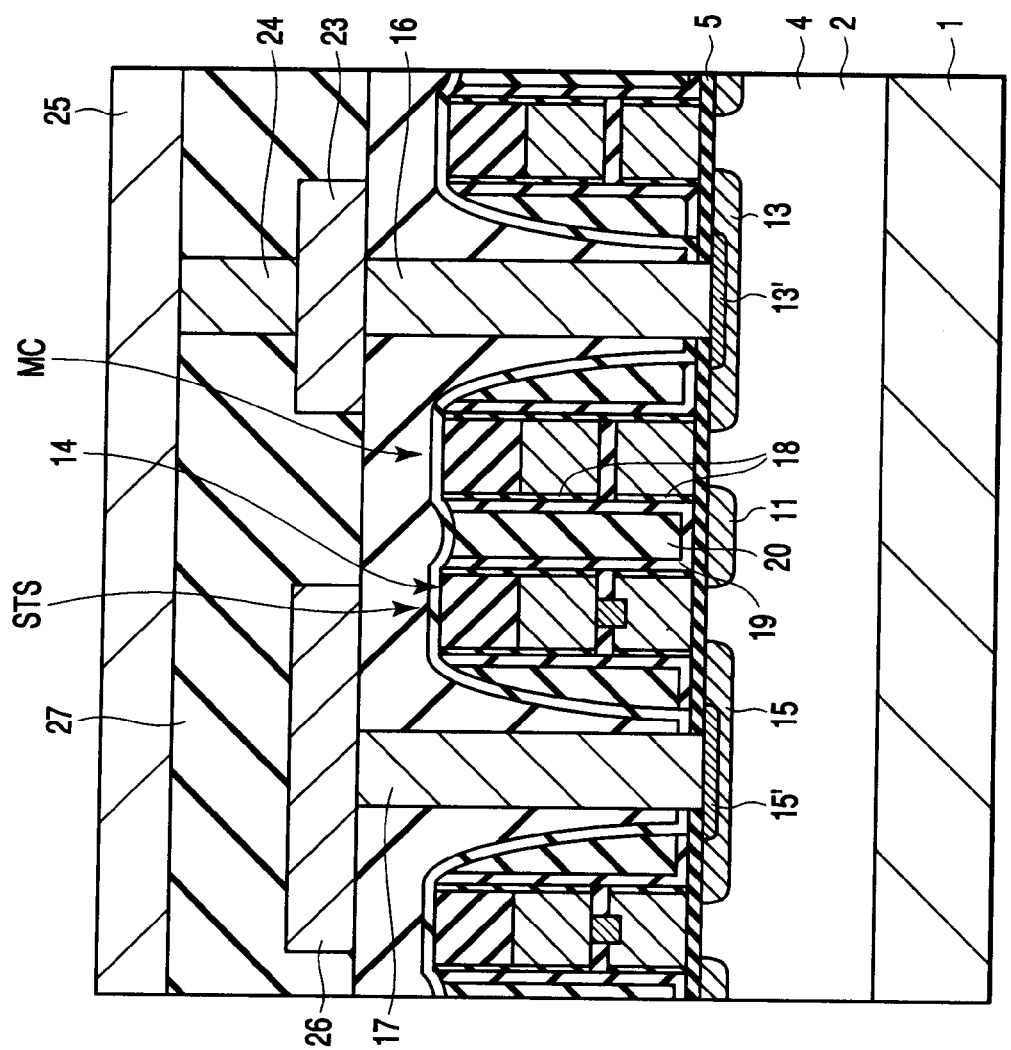
FIG. 35 is a cross sectional view showing an example of a transistor cell type nonvolatile semiconductor memory device.

Particularly, as shown in FIG. 34, this invention can be applied to a three-transistor cell type nonvolatile semiconductor memory device having one memory cell MC serially connected between a drain-side selection transistor STD and a source-side selection transistor STS. Further, as shown in FIG. 35, this invention can be applied to a two-transistor cell type nonvolatile semiconductor memory device having one memory cell MC connected in series with a source-side selection transistor STS (or drain-side selection transistor STD).

Also, this invention can be applied to a nonvolatile semiconductor memory device having NAND cells and three-transistor cells formed in one chip, a nonvolatile semiconductor memory device having NAND cells and two-transistor cells formed in one chip and a nonvolatile semiconductor memory device having NAND cells, two-transistor cells and three-transistor cells formed in one chip.

Further, the above embodiments can be independently performed and can be adequately combined and performed in addition to the above cases.

The above embodiments contain inventions of various stages and the inventions of various stages can be extracted by adequately combining a plurality of constituents disclosed in each embodiment.

Further, the embodiments are explained based on an example in which this invention is applied to a nonvolatile semiconductor memory device. However, this invention is not limited to the nonvolatile semiconductor memory device and a semiconductor integrated circuit device such as a processor or system LSI containing a nonvolatile semiconductor memory device can be included in the scope of this invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing method of a semiconductor integrated circuit device comprising:
   forming first and second gate electrodes on a semiconductor substrate;
   doping impurity into the semiconductor substrate with the first and second gate electrodes used as a mask to form first and second diffusion layers in the semiconductor substrate;
   forming a first insulating film which has concave portions between the first and second gate electrodes on the first and second diffusion layers and first and second gate electrodes;
   forming a second insulating film on the first insulating film to fill the concave portions between the first and second gate electrodes, a hydrogen content in the first insulating film being less than that in the second insulating film;
   forming a third insulating film on the second insulating film;
   forming an inter-level insulating film having a main component different from that of the third insulating film on the third insulating film;
   etching a contact electrode forming portion of the first diffusion layer to form a contact hole, and
   forming a contact electrode connected to the first diffusion layer in the contact hole.

2. The manufacturing method according to claim 1, wherein the first insulating film is processed in an oxidation atmosphere after the first insulating film was formed.

3. The method according to claim 1, further comprising removing a part of the second insulating film and leaving the resultant insulating film on a side surface of the first gate electrode facing the first diffusion layer to form a sidewall insulating film.

4. The method according to claim 3, wherein a region between the first and second gate electrodes is filled with the sidewall insulating film.

5. The method according to claim 4, further comprising doping an impurity into the semiconductor substrate using the second insulating film and the first and second electrodes as a mask after the sidewall insulating film was formed.

6. The method according to claim 1, wherein the first insulating film is formed in an atmosphere of a mixture of $SiH_2Cl_2$ and $N_2O$ at temperature of 780° C.

7. The method according to claim 6, wherein the second insulating film is formed in an atmosphere of $Si(OC_2H_5)_4$ at temperature of 700° C.

8. A manufacturing method of a semiconductor integrated circuit device comprising:
   forming first gate electrode on a semiconductor substrate;
   forming second gate electrodes in line on a semiconductor substrate, the first gate electrode being adjacent to an end of the second gate electrodes formed in line;
   doping impurity into the semiconductor substrate with the first and second gate electrodes used as a mask to form first diffusion layers in the semiconductor substrate;
   forming a first insulating film which has concave portions between the first and second gate electrodes on the first and second diffusion layers and first and second gate electrodes;
   forming a second insulating film on the first insulating film to fill the concave portions between the first and second gate electrodes, a hydrogen content in the first insulating film being less than that in the second insulating film;
   forming a third insulating film on the second insulating film;
   forming an inter-level insulating film having a main component different from that of the third insulating film on the third insulating film;
   etching a contact electrode forming portion, the contact electrode forming portion opposing the second gate electrode with the first gate electrode interposed therebetween to form a contact hole; and
   forming a contact electrode connected to the first diffusion layer in the contact hole.

9. The method according to claim 8, wherein the first insulating film is processed in an oxidation atmosphere after the first insulating film was formed.

10. The method according to claim 9, further comprising removing a part of the second insulating film and leaving the resultant insulating film on a side surface of the first gate electrode facing the first diffusion layer to form a sidewall insulating film.

11. The method according to claim 10, wherein a region between the first and second gate electrodes is filled with the sidewall insulating film.

12. The method according to claim 11, further comprising doping an impurity into the semiconductor substrate using the second insulating film and the first and second electrodes as a mask after the sidewall insulating film was formed.

13. The method according to claim 8, wherein the first insulating film is formed in an atmosphere of a mixture of $SiH_2Cl_2$ and $N_2O$ at temperature of 780° C.

14. The method according to claim 13, wherein the second insulating film is formed in an atmosphere of $Si(OC_2H_5)_4$ at temperature of 700° C.

15. A manufacturing method of a semiconductor integrated circuit device comprising:
   forming element regions which are isolated each other by an element isolation insulating film in a semiconductor substrate;

making a concave in the element isolation insulating film to lower a surface of the element isolation insulating film than a surface of the element regions;

forming first and second insulating film in the concave;

forming a third insulating film on the second insulating film and on the element isolation insulating film;

forming an inter-level insulating film having a main component different from that of the third insulating film on the third insulating film;

etching a contact electrode forming portion of the element region to form a contact hole; and forming a contact electrode connected to the element region in the contact hole.

16. The method according to claim 15, the third insulating film is formed so as to flatten a surface of the third insulating film.

17. The method according to claim 15, wherein the first insulating film is formed in an atmosphere of a mixture of $SiH_2Cl_2$ and $N_2O$ at temperature of 780° C.

18. The method according to claim 17, wherein the second insulating film is formed in an atmosphere of $Si(OC_2H_5)_4$ at temperature of 700° C.

19. The method according to claim 15, further comprising forming a gate electrode on the semiconductor substrate, wherein the concave is made when the gate electrode is formed.

* * * * *

UNITED STATES PATENT AND TRADEMARK OFFICE
CERTIFICATE OF CORRECTION

PATENT NO. : 7,687,346 B2 Page 1 of 1
APPLICATION NO. : 11/943325
DATED : March 30, 2010
INVENTOR(S) : Toshitake Yaegashi et al.

It is certified that error appears in the above-identified patent and that said Letters Patent is hereby corrected as shown below:

Column 26, line 20, change "first diffusion layers" to --first and second diffusion layers--.

Signed and Sealed this

Eighth Day of June, 2010

David J. Kappos
*Director of the United States Patent and Trademark Office*